(12) United States Patent
Lin et al.

(10) Patent No.: US 12,336,211 B2
(45) Date of Patent: Jun. 17, 2025

(54) DIELECTRIC LAYER ON SEMICONDUCTOR DEVICE AND METHOD OF FORMING THE SAME

(71) Applicant: Taiwan Semiconductor Manufacturing Co., Ltd., Hsinchu (TW)

(72) Inventors: Cheng-I Lin, Hsinchu (TW); Ming-Ho Lin, Taipei (TW); Chun-Heng Chen, Hsinchu (TW); Yung-Cheng Lu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 703 days.

(21) Appl. No.: 17/393,584

(22) Filed: Aug. 4, 2021

(65) Prior Publication Data
US 2022/0384611 A1    Dec. 1, 2022

Related U.S. Application Data

(60) Provisional application No. 63/193,866, filed on May 27, 2021.

(51) Int. Cl.
| H10D 30/68 | (2025.01) |
| H10D 30/01 | (2025.01) |
| H10D 30/62 | (2025.01) |
| H10D 84/01 | (2025.01) |
| H10D 84/03 | (2025.01) |

(52) U.S. Cl.
CPC ......... *H10D 30/0243* (2025.01); *H10D 30/62* (2025.01); *H10D 84/0147* (2025.01); *H10D 84/0158* (2025.01); *H10D 84/038* (2025.01)

(58) Field of Classification Search
None
See application file for complete search history.

(56) References Cited

U.S. PATENT DOCUMENTS

| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |

(Continued)

FOREIGN PATENT DOCUMENTS

| DE | 102020114865 A1 | 5/2021 |
| TW | 202042292 A | 11/2020 |

(Continued)

*Primary Examiner* — Joseph C. Nicely
*Assistant Examiner* — Lamont B Koo
(74) *Attorney, Agent, or Firm* — Slater Matsil, LLP

(57) ABSTRACT

A method of forming a semiconductor device includes forming a first layer on a semiconductor fin; forming a mask on the first layer, the mask being thicker on a top of the semiconductor fin than along a sidewall of the semiconductor fin. The first layer is thinned along the sidewall of the semiconductor fin using the mask. A second layer is formed on the semiconductor fin, the second layer covering the mask and the first layer. A dummy gate layer is formed on the semiconductor fin and patterned to expose a top surface of the semiconductor fin.

20 Claims, 33 Drawing Sheets

(56) References Cited

U.S. PATENT DOCUMENTS

| | | | |
|---|---|---|---|
| 9,564,489 | B2 | 2/2017 | Yeo et al. |
| 9,576,814 | B2 | 2/2017 | Wu et al. |
| 9,601,342 | B2 | 3/2017 | Lee et al. |
| 9,608,116 | B2 | 3/2017 | Ching et al. |
| 2010/0224916 | A1* | 9/2010 | Shimizu .................. H01L 29/45 |
| | | | 257/532 |
| 2018/0053773 | A1* | 2/2018 | Leobandung ......... H01L 29/785 |
| 2019/0259862 | A1 | 8/2019 | Cheng et al. |
| 2020/0135467 | A1 | 4/2020 | Ma et al. |
| 2020/0144265 | A1* | 5/2020 | Bao .................... H01L 29/6653 |
| 2020/0321453 | A1 | 10/2020 | Ching et al. |
| 2020/0350422 | A1 | 11/2020 | Wang et al. |
| 2021/0083072 | A1 | 3/2021 | Feng et al. |
| 2021/0099845 | A1 | 4/2021 | Lin et al. |

FOREIGN PATENT DOCUMENTS

| | | |
|---|---|---|
| TW | 202107547 A | 2/2021 |
| TW | 202114059 A | 4/2021 |
| WO | 2014159481 A1 | 10/2014 |

\* cited by examiner

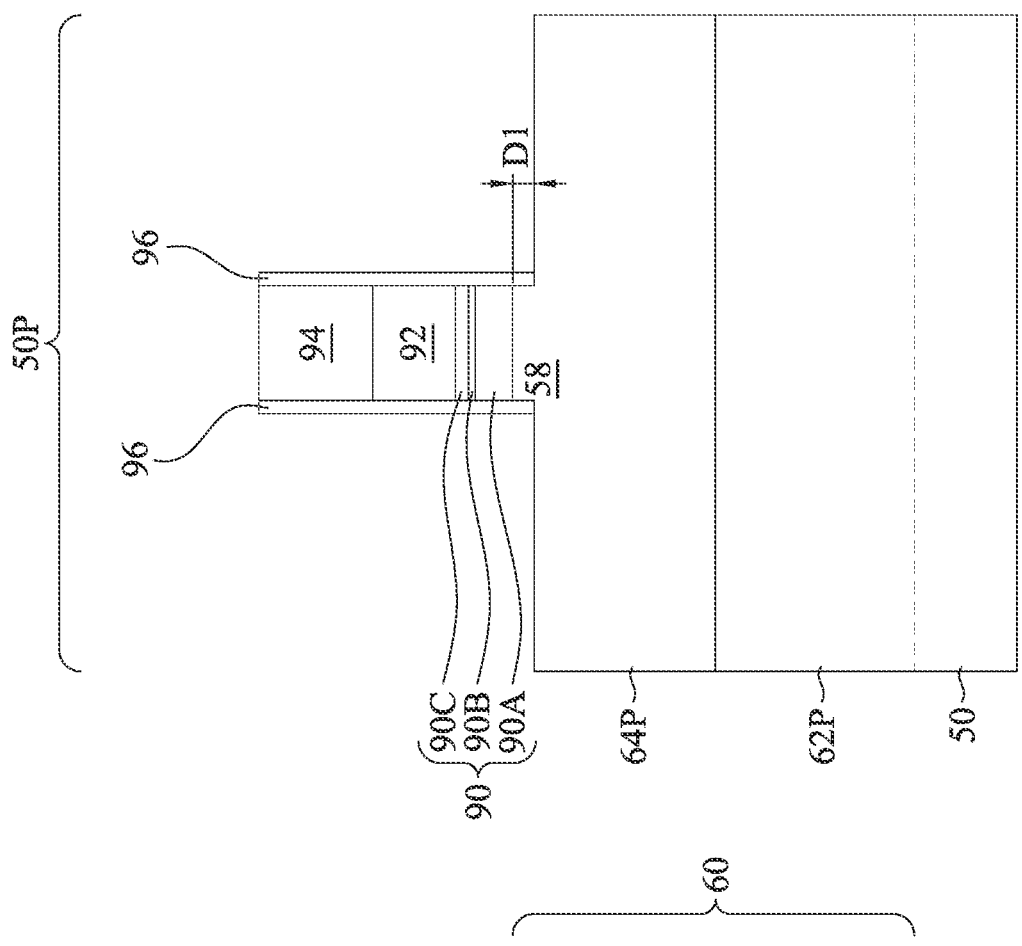
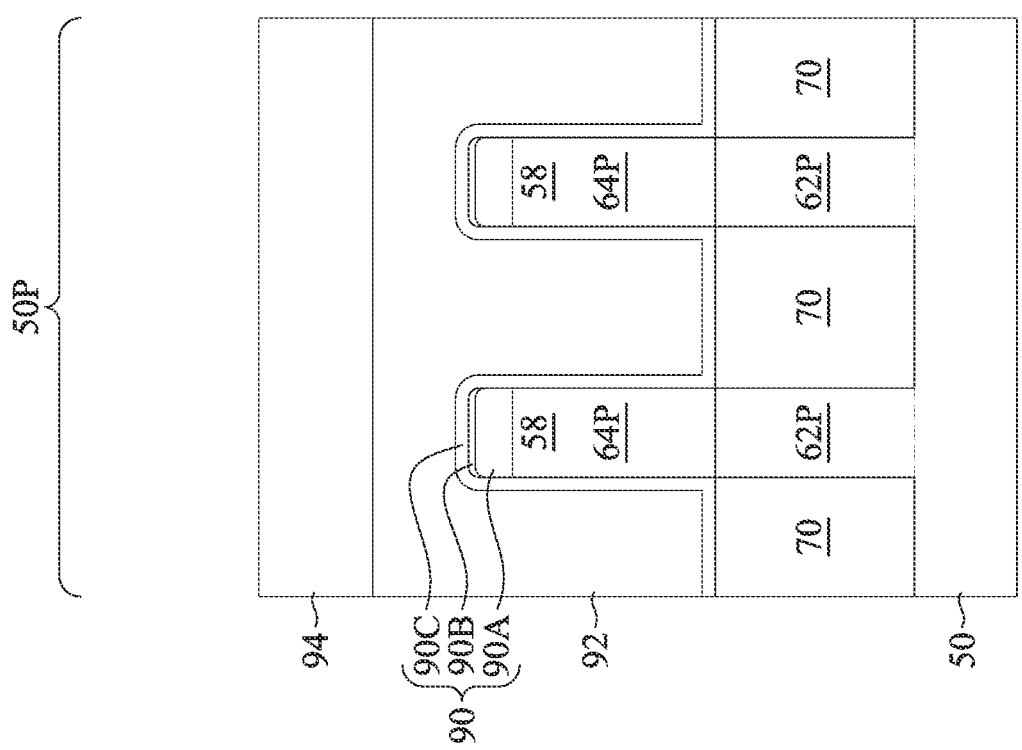
Fig. 14B
Fig. 14A

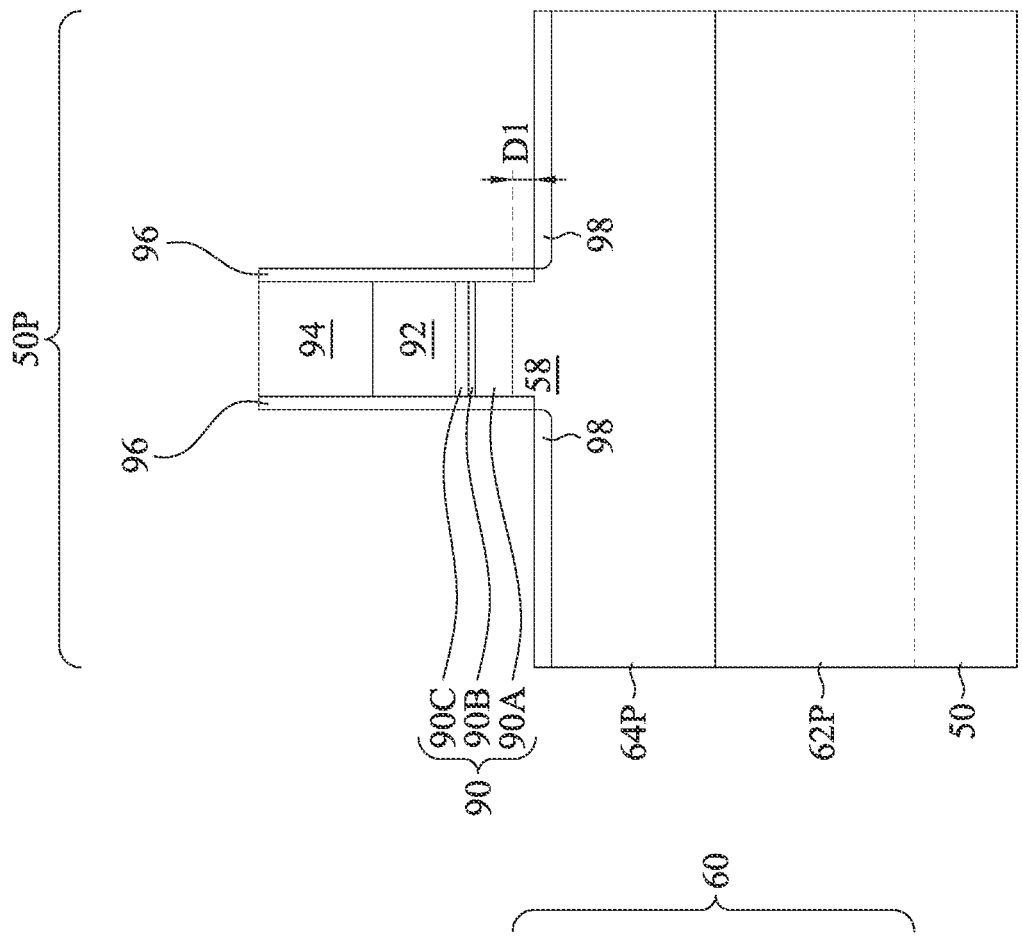
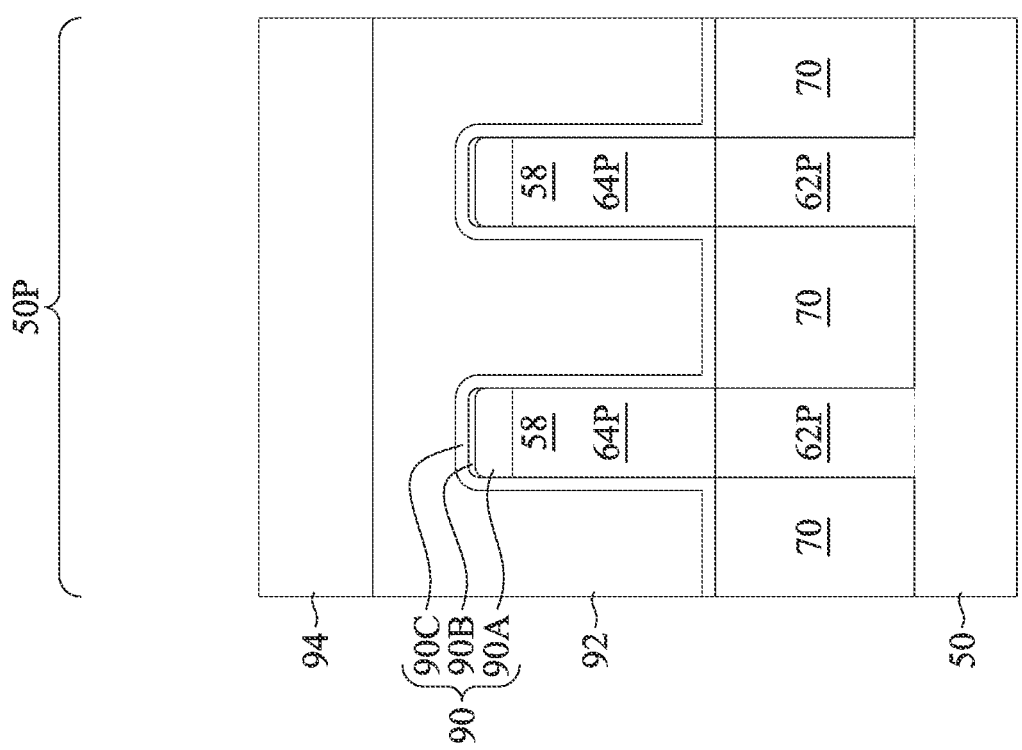
Fig. 15B
Fig. 15A

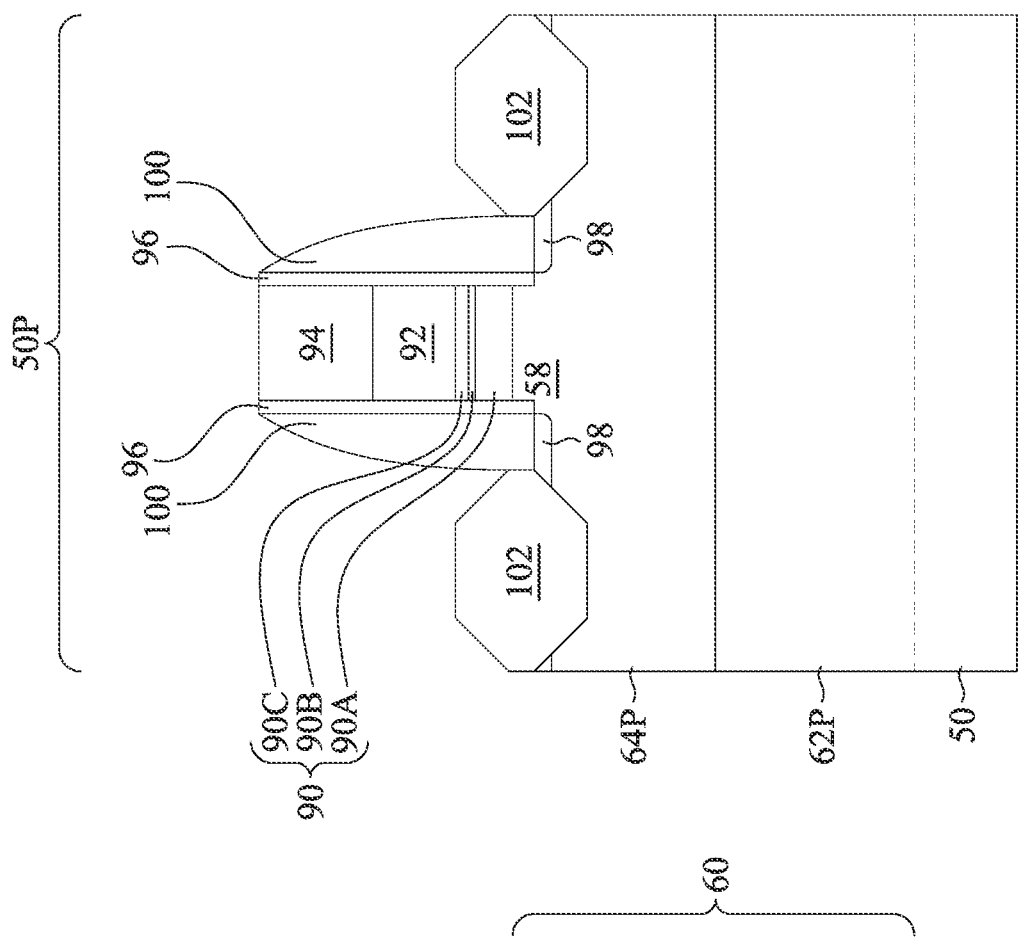
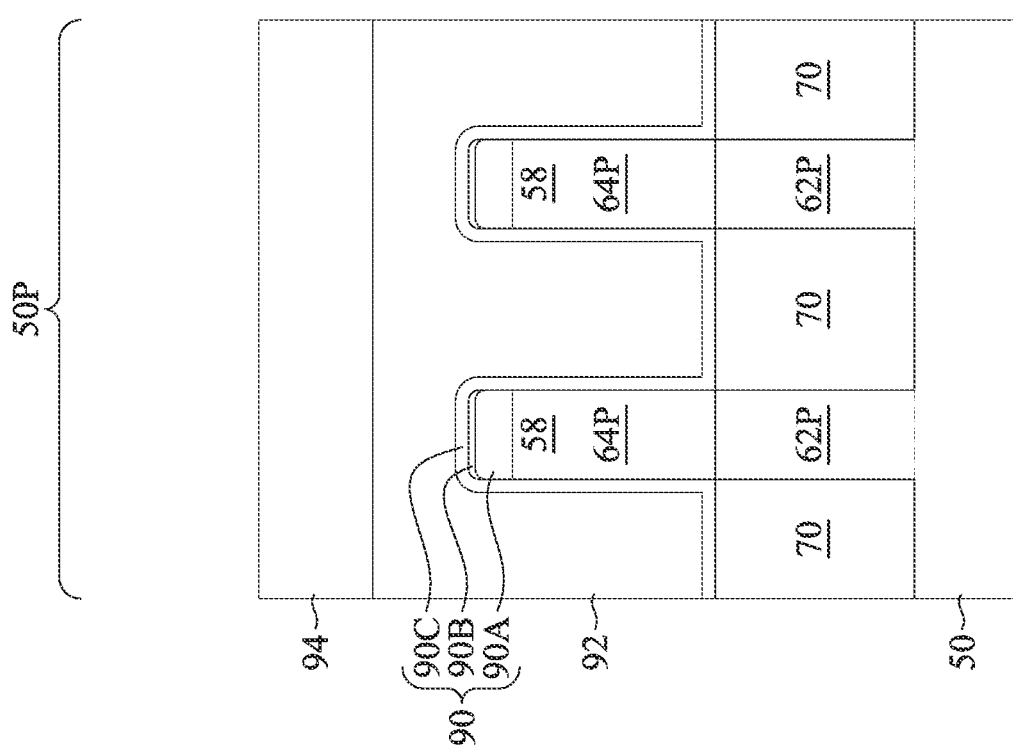
Fig. 17B
Fig. 17A

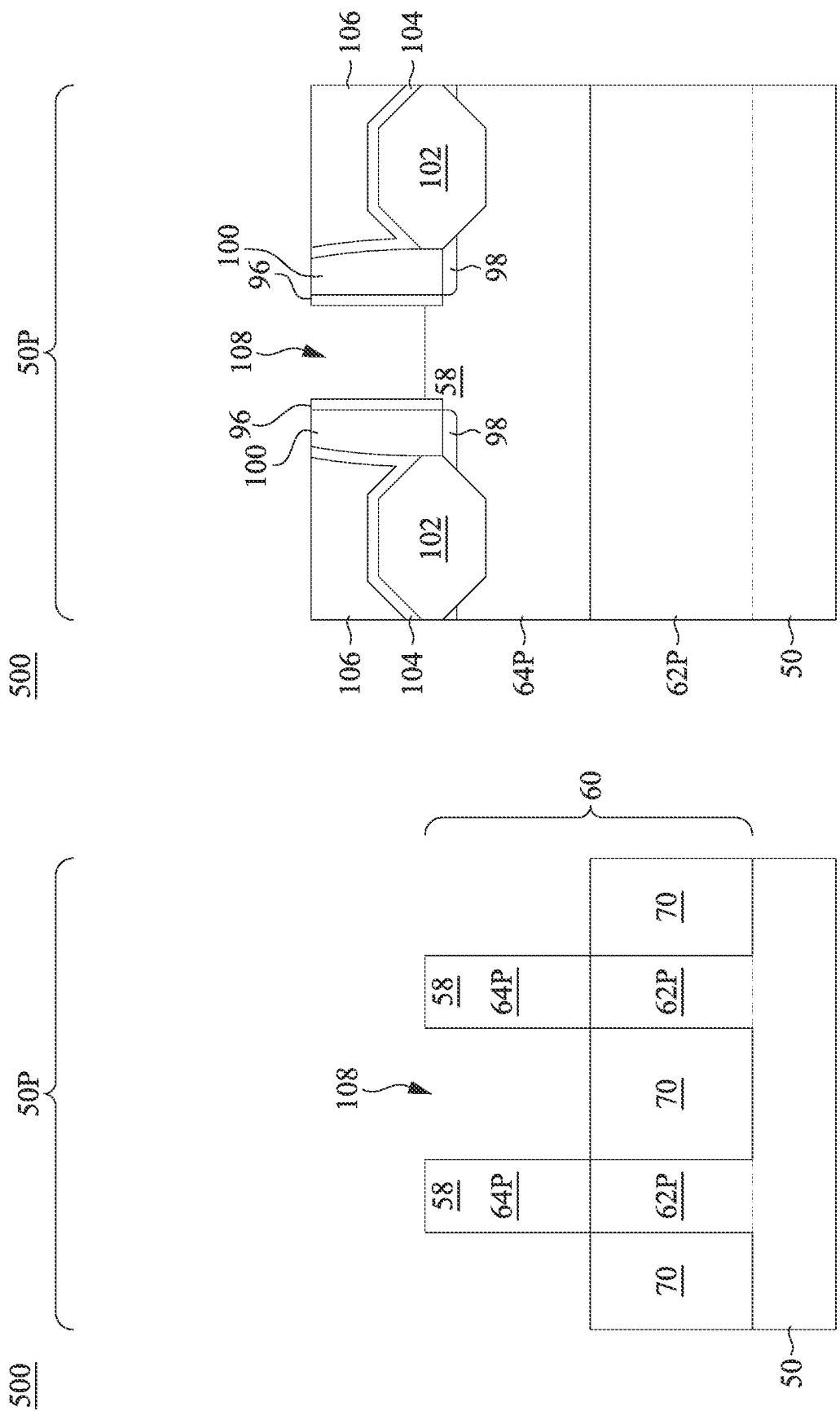

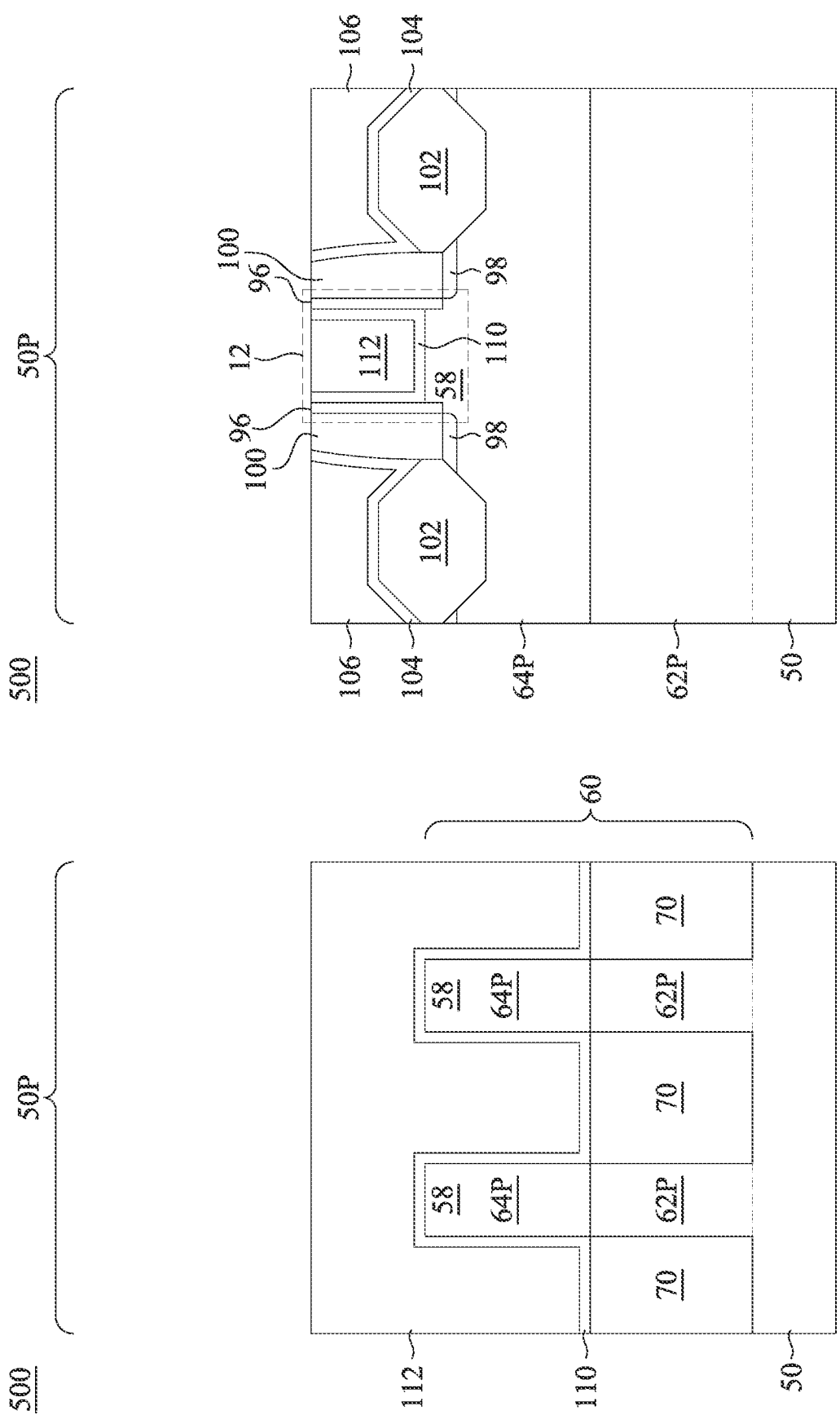

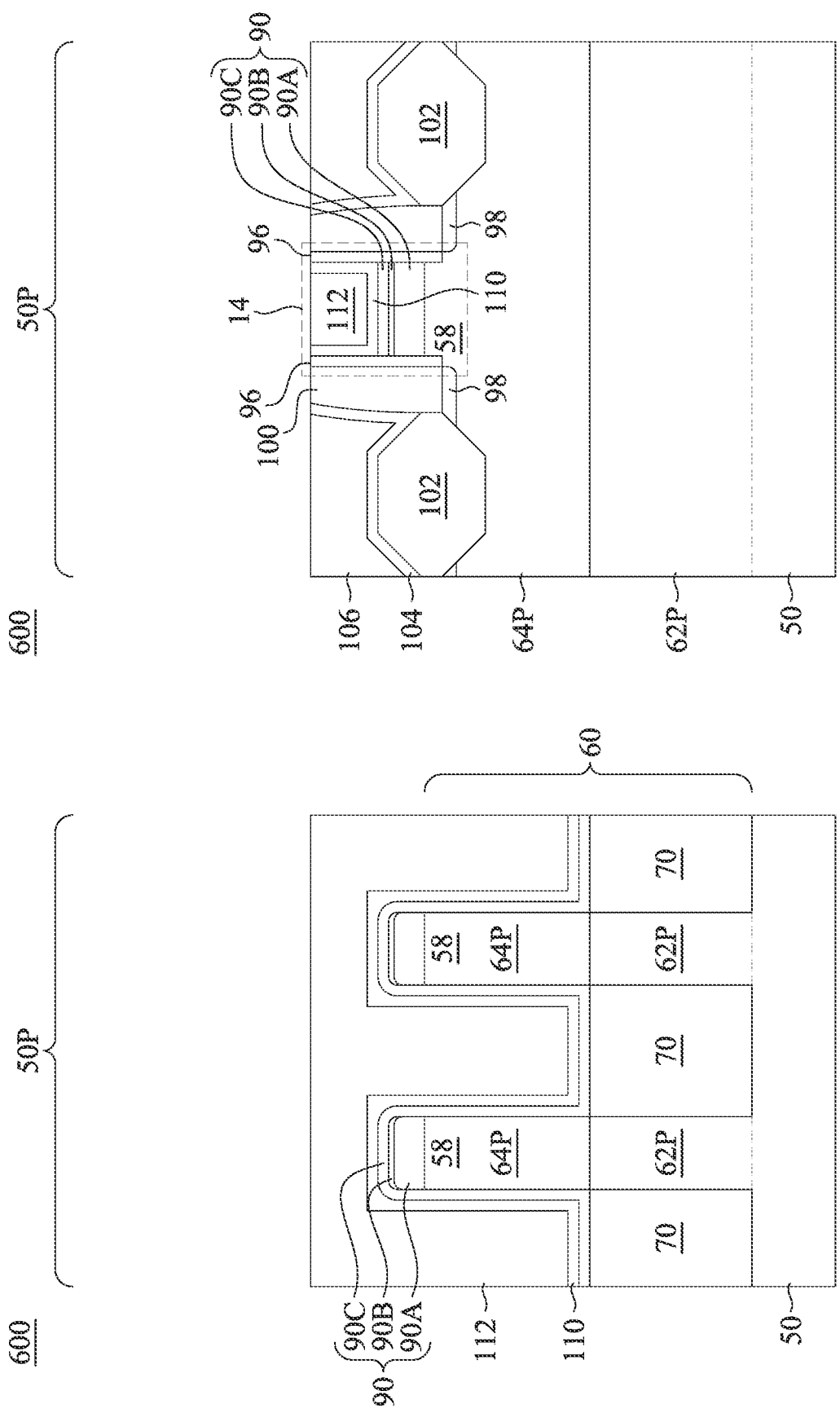

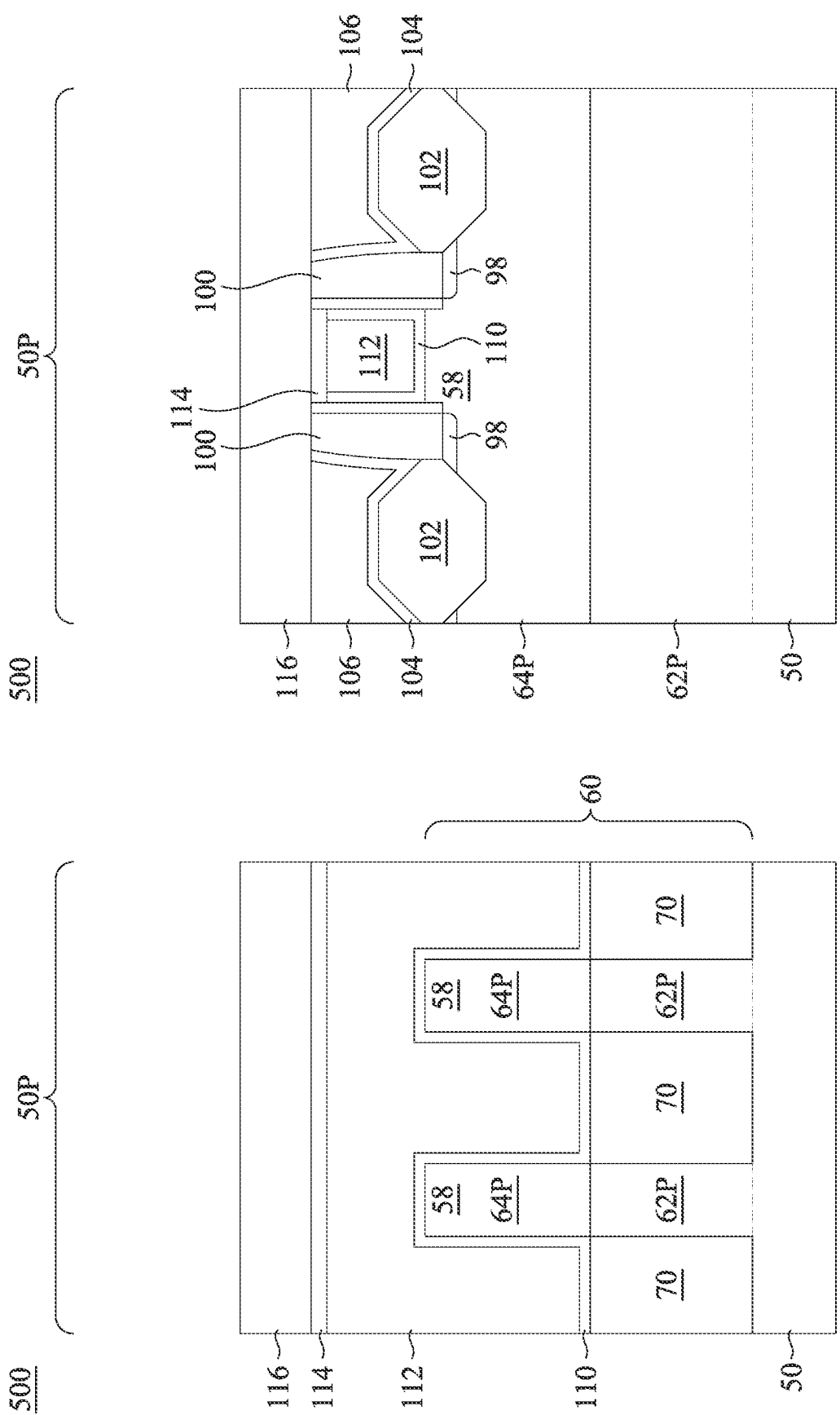

DIELECTRIC LAYER ON SEMICONDUCTOR DEVICE AND METHOD OF FORMING THE SAME

PRIORITY CLAIM AND CROSS-REFERENCE

This application claims the benefit of U.S. Provisional Application No. 63/193,866, filed on May 27, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, 9, 10, 11A, 11B, 12A, 12B, 13A, 13B, 14A, 14B, 15A, 15B, 16A, 16B, 17A, 17B, 17C, 17D, 18A, 18B, 19A, 19B, 20A, 20B, 20C, 20D, 21A, 21B, 21C, 21D, 21E, 21F, 22A, 22B, 22C, 22D, 23A, 23B, 23C, 23D, 24A, 24B, 24C, and 24D are cross-sectional views of intermediate stages in the manufacturing of FinFETs, in accordance with some embodiments.

DETAILED DESCRIPTION

Figure 1:
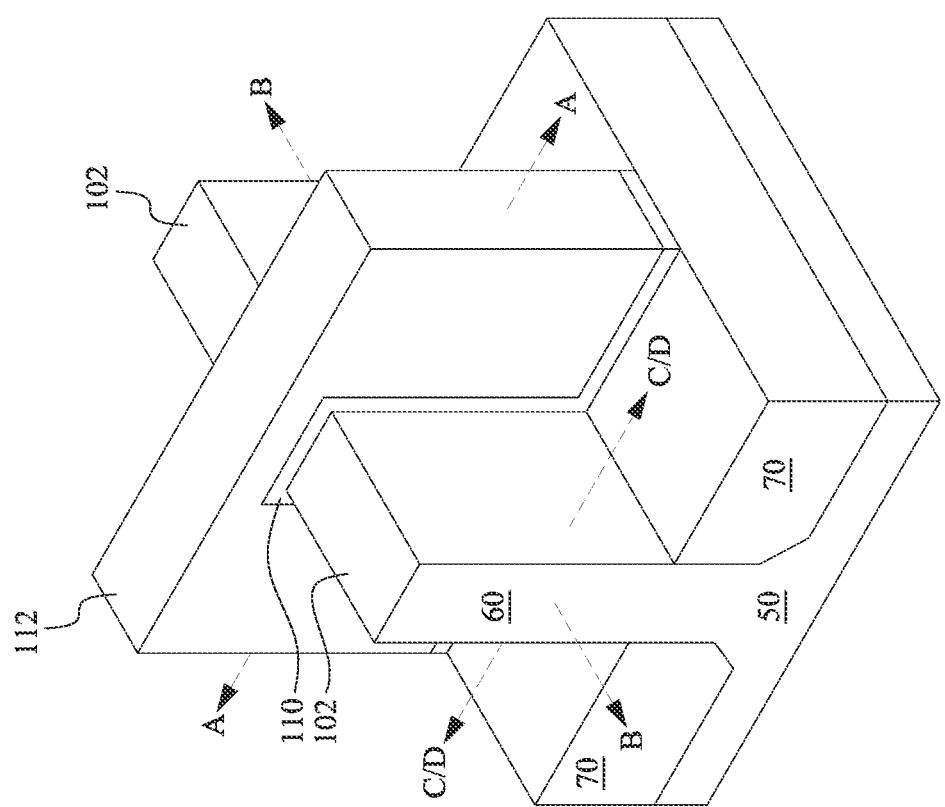
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, dielectric layers are formed over semiconductor features, e.g. fins, prior to forming dummy gates over the fins. The dielectric layers include a mask layer that enables a greater thickness of dielectric material to be formed over the top of the fins than over sidewalls of the fins. The dielectric layers may reduce fin loss from the top surface of the fins during subsequent patterning processes of the dummy gates, which may boost device performance by reducing contact resistance. The process to form the dielectric layers can be integrated with and followed by an oxidation deposition process that is low cost and achieves high rates of wafers per hour.

FIG. 1 illustrates an example of a FinFET in a three-dimensional view, in accordance with some embodiments. The FinFET comprises a fin 60 extending from a substrate 50 (e.g., a semiconductor substrate). Isolation regions 70 are disposed over the substrate 50, and the fin 60 protrudes above and from between neighboring isolation regions 70. Although the isolation regions 70 are described/illustrated as being separate from the substrate 50, as used herein the term "substrate" may be used to refer to just the semiconductor substrate or a semiconductor substrate inclusive of isolation regions. Additionally, although the fin 60 is illustrated as a single, continuous material as the substrate 50, the fin 60 and/or the substrate 50 may comprise a single material or a plurality of materials. In this context, the fin 60 refers to the portion extending between the neighboring isolation regions 70.

A gate dielectric layer 110 is along sidewalls and over a top surface of the fin 60, and a gate electrode 112 is over the gate dielectric layer 110. Source/drain regions 102 are disposed in opposite sides of the fin 60 with respect to the gate dielectric layer 110 and gate electrode 112. FIG. 1 further illustrates reference cross-sections that are used in later figures. Cross-section A-A is along a longitudinal axis of the gate electrode 112 and in a direction, for example, perpendicular to the direction of current flow between the source/drain regions 102 of the FinFET. Cross-section B-B is perpendicular to cross-section A-A and is along a longitudinal axis of the fin 60 and in a direction of, for example, a current flow between the source/drain regions 102 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 23B are cross-sectional views of intermediate stages in the manufacturing of FinFETs, in accordance with some embodiments. FIGS. 2, 3, 4, 5, 6, 7, 8, 9, and 10 illustrate reference cross-section A-A illustrated in FIG. 1, except for multiple fins/FinFETs. FIGS. 11A, 12A, 13A, 14A, 15A, 16A, 17A, 18A, 19A, 20A, 20C, 21A, 21D, 22A, 22C, 23A, 23C, 24A, and 24C are illustrated along reference cross-section A-A illustrated in FIG. 1, and FIGS. 11B, 12B, 13B, 14B, 15B, 16B, 17B, 18B, 19B, 20B, 20D, 21B, 21C, 21E, 21F, 22B, 22D, 23B, 23D, 24B, and 24D are illustrated along a similar cross-section B-B illustrated in FIG. 1, except for multiple fins/FinFETs. FIGS. 17C and 17D are illustrated along reference cross-section C/D-C/D illustrated in FIG. 1, except for multiple fins/FinFETs.

Figure 2:
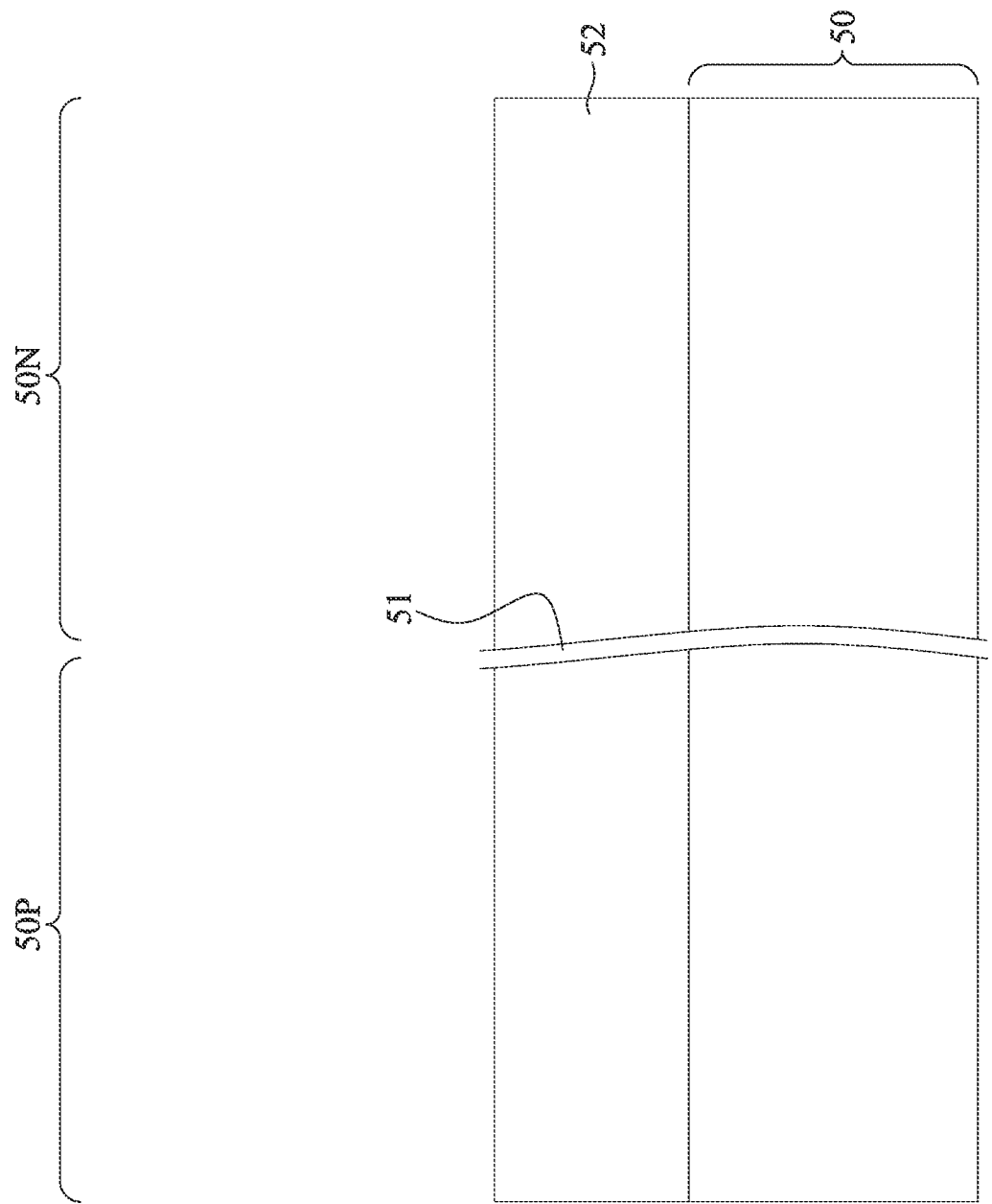

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices such as NMOS transistors, e.g., n-type FinFETs. The p-type region 50P can be for forming p-type devices such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Appropriate wells (not shown) may be formed in the substrate 50. In the embodiment shown, a p-type well is formed in the n-type region 50N, and a n-type well is formed in the p-type region 50P. The wells are formed by implanting the n-type region 50N and the p-type region 50P with p-type and/or n-type impurities. After the implants of the n-type region 50N and p-type region 50P, an anneal may be performed to activate the p-type and/or n-type impurities that were implanted.

In embodiments with different well types, different implant steps for the n-type region 50N and the p-type region 50P may be achieved using a photoresist or other masks (not shown). For example, a photoresist may be formed over the n-type region 50N of the substrate 50. The photoresist is patterned to expose the p-type region 50P of the substrate 50, such as a PMOS region. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N, such as an NMOS region. The n-type impurities may be phosphorus, arsenic, antimony, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the p-type region 50P, a photoresist is formed over the p-type region 50P of the substrate 50. The photoresist is patterned to expose the n-type region 50N of the substrate 50, such as the NMOS region. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P, such as the PMOS region. The p-type impurities may be boron, $BF_2$, indium, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

A first semiconductor region 52 is formed over the substrate 50. The first semiconductor region 52 is a semiconductor material, such as silicon, silicon carbide, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like. In some embodiments, the first semiconductor region 52 is silicon. The first semiconductor region 52 is epitaxially grown on the substrate 50. As discussed further below, the first semiconductor region 52 will be patterned to form fins in the n-type region 50N.

Figure 3:
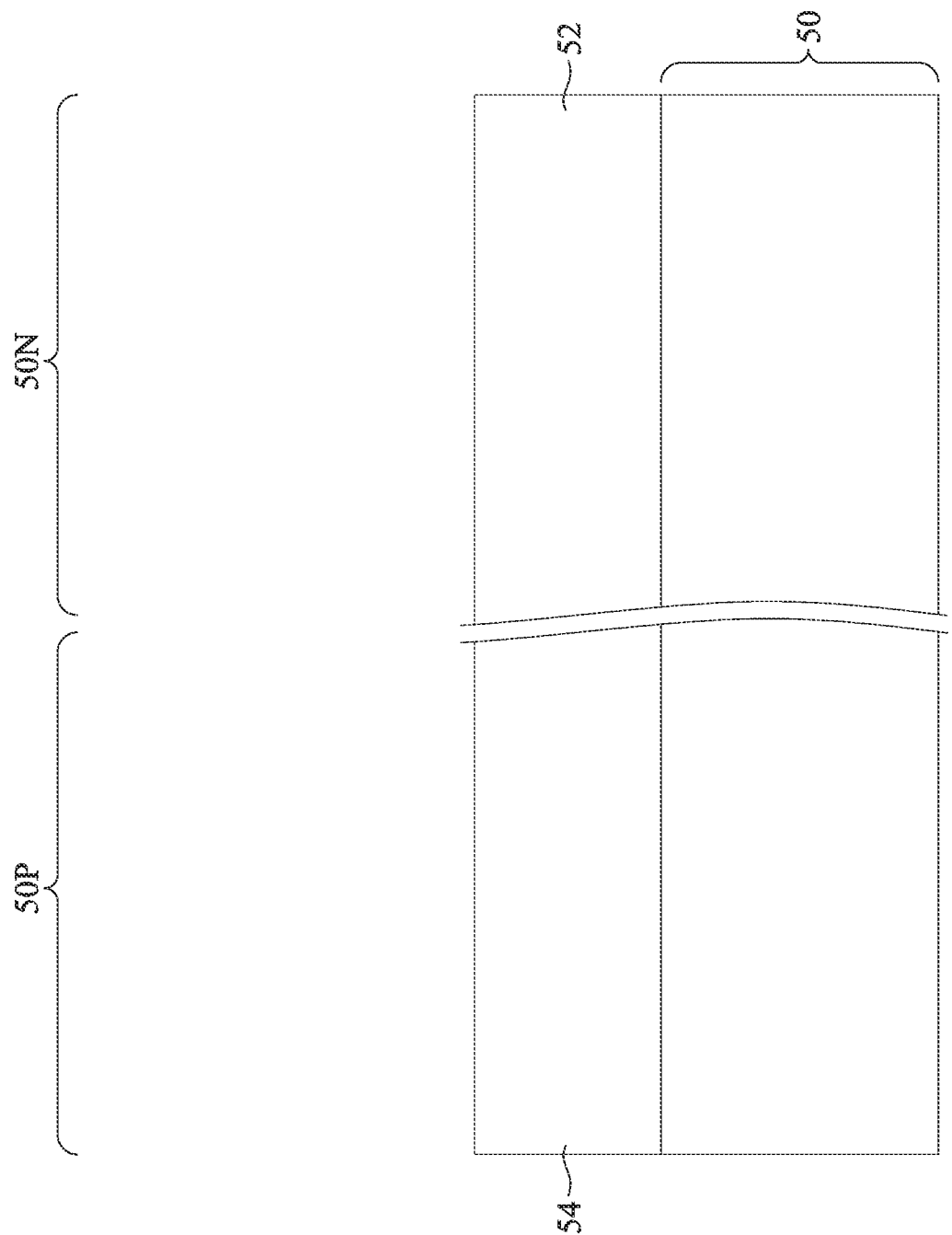

In FIG. 3, a second semiconductor region 54 is formed over the substrate 50. The second semiconductor region 54 is a semiconductor material, such as silicon germanium (e.g., $Si_xGe_{1-x}$, where x can be in the range of 0 to 1), pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like. In some embodiments, the second semiconductor region 54 is silicon germanium. The second semiconductor region 54 is epitaxially grown on the substrate 50. As an example of forming the second semiconductor region 54, an opening may be formed in the first semiconductor region 52 over the p-type region 50P of the substrate. The opening may be formed by one or more etching process(es), using a photoresist as an etching mask. The etching process(es) may include a wet etch, a dry etch, a reactive ion etch (RIE), a neutral beam etch (NBE), a combination thereof, or the like, and may be anisotropic. The second semiconductor region is then epitaxially grown in the opening, on the substrate 50.

Silicon and silicon germanium have different lattice constants. As such, the second semiconductor region 54 and substrate 50 have mismatched lattice constants. The lattice constant mismatch depends on the germanium concentration of the second semiconductor region 54, where a higher germanium concentration results in a greater lattice constant mismatch. The lattice constant mismatch induces a compressive strain in the second semiconductor region 54, which may increase the carrier mobility of the second semiconductor region 54, which may improve the channel region mobility of subsequently formed p-type devices. Channel regions formed in the second semiconductor region may be partially or fully strained channel regions.

In some embodiments, the first semiconductor region 52 and second semiconductor region 54 are in situ doped during growth to have appropriate doped regions (e.g., wells). The doped regions of the first semiconductor region 52 and second semiconductor region 54 may be of the same doping type as the underlying doped regions of the substrate 50. The doped regions of the first semiconductor region 52 and second semiconductor region 54 may have the same doping concentration as the underlying doped regions of the substrate 50, or may have different doping concentrations. In some embodiments, the doping of the first semiconductor region 52 and second semiconductor region 54 may obviate the implantations in the substrate 50, although in situ and implantation doping may be used together.

Figure 4:
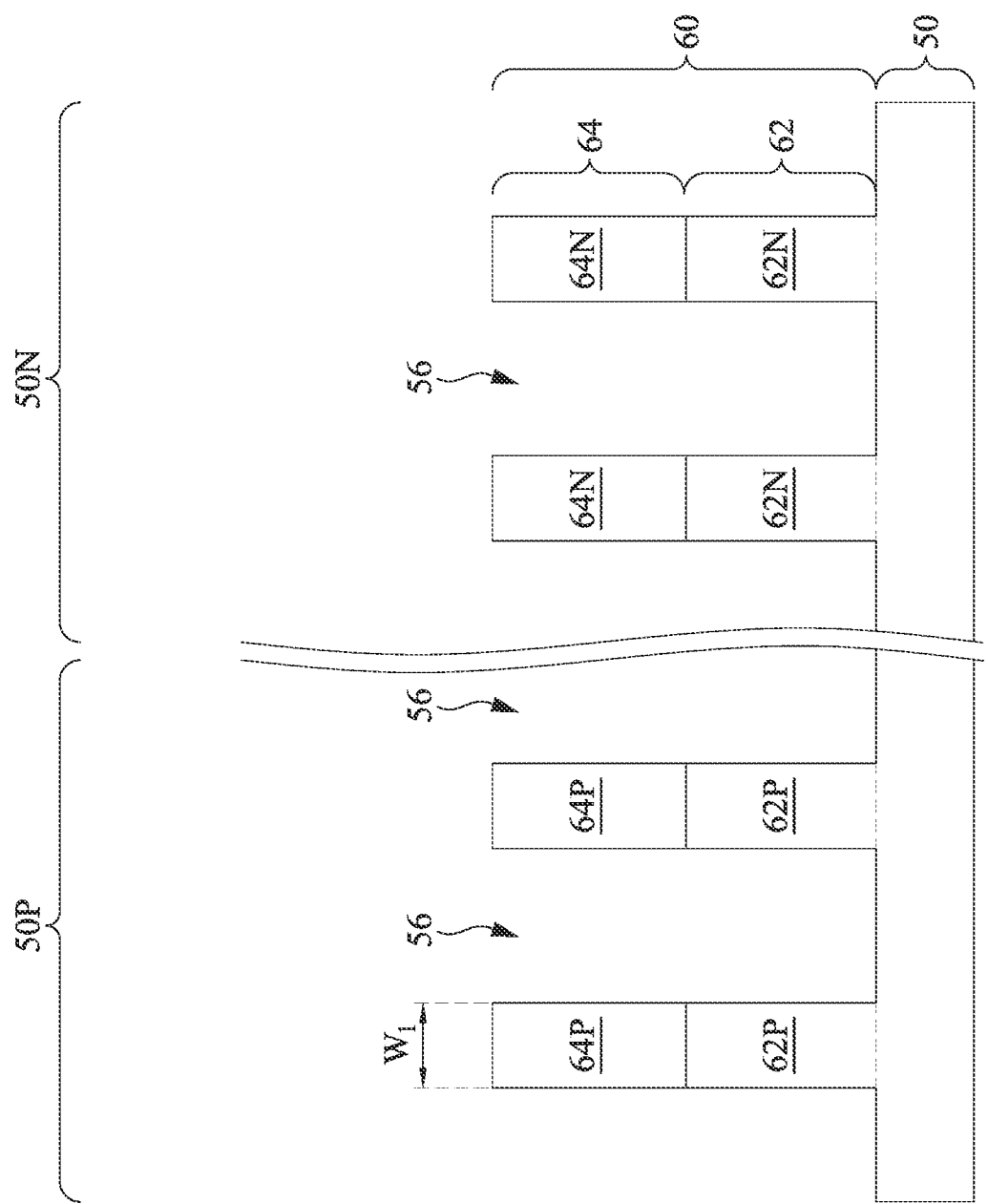

In FIG. 4, trenches 56 are formed in the first semiconductor region 52 and second semiconductor region 54 (and optionally the substrate 50). The trenches 56 may be formed by one or more etching process(es), using a photoresist as an etching mask. The etching process(es) may include a wet etch, a dry etch, a reactive ion etch (RIE), a neutral beam etch (NBE), a combination thereof, or the like, and may be anisotropic. The trenches 56 may extend partially into the first semiconductor region 52 and second semiconductor region 54, or may extend through the semiconductor regions and into the substrate 50. Portions of the first semiconductor region 52 and second semiconductor region 54 (and optionally the substrate 50) remaining between the trenches 56 are referred to as fins 60. The fins 60 each include a lower portion 62 and a upper portion 64. The lower portions 62 include lower portions 62N and 62P, with the lower portions 62N comprising remaining portions of the n-type region 50N of the substrate 50, and the lower portions 62P comprising remaining portions of the p-type region 50P of the substrate 50. The upper portions 64 include upper portions 64N and 64P, with the upper portions 64N comprising remaining portions of the first semiconductor region 52, and the upper portions 64P comprising remaining portions of the second semiconductor region 54. The fins 60 are formed to a first width $W_1$. In some embodiments, the first width $W_1$ is in a range of 5 nm to 15 nm. Such a fin width may allow the fin to retain a sufficient thickness after subsequent etching process(es) (described below).

The fins may be patterned by any suitable method. For example, the fins 60 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 60.

Figure 5:
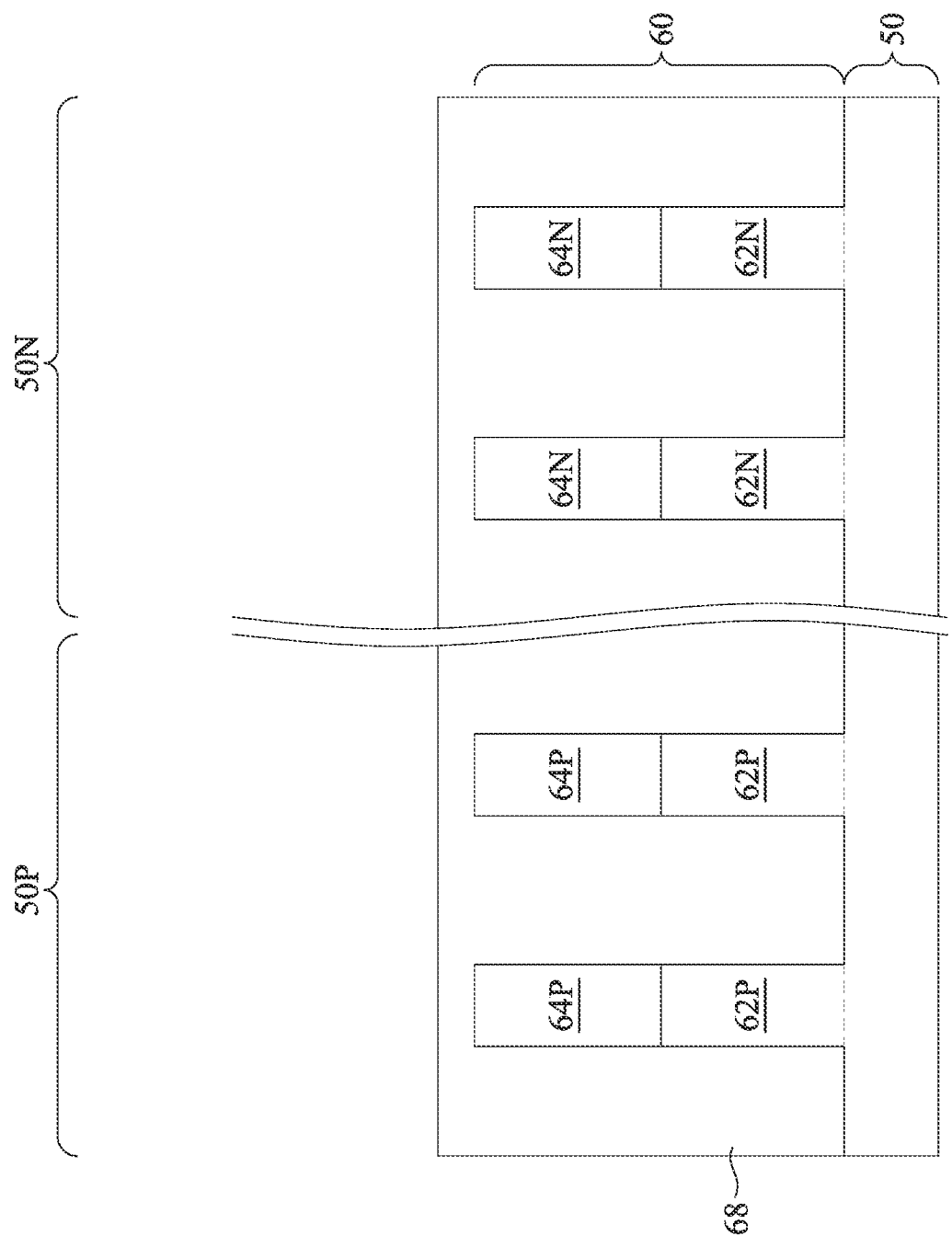

In FIG. 5, an insulation material 68 is formed over the substrate 50 and between neighboring fins 60. The insulation material 68 may be formed such that excess portions of the insulation material 68 covers the fins 60. The insulation material 68 may be an oxide, such as silicon oxide, a nitride, the like, or a combination thereof, and may be formed by a high density plasma chemical vapor deposition (HDP-CVD), a flowable chemical vapor deposition (FCVD) (e.g., a chemical vapor deposition (CVD) based material deposition in a remote plasma system and post curing to make it convert to another material, such as an oxide), the like, or a combination thereof. Other insulation materials formed by any acceptable process may be used. In the illustrated embodiment, the insulation material 68 is silicon oxide formed by a FCVD process. An anneal process may be performed once the insulation material is formed. Although the insulation material 68 is illustrated as a single layer, some embodiments may utilize multiple layers. For example, in some embodiments a liner (not shown) may first be formed along a surface of the substrate 50 and the fins 60. Thereafter, a fill material, such as those discussed above may be formed over the liner.

Figure 6:
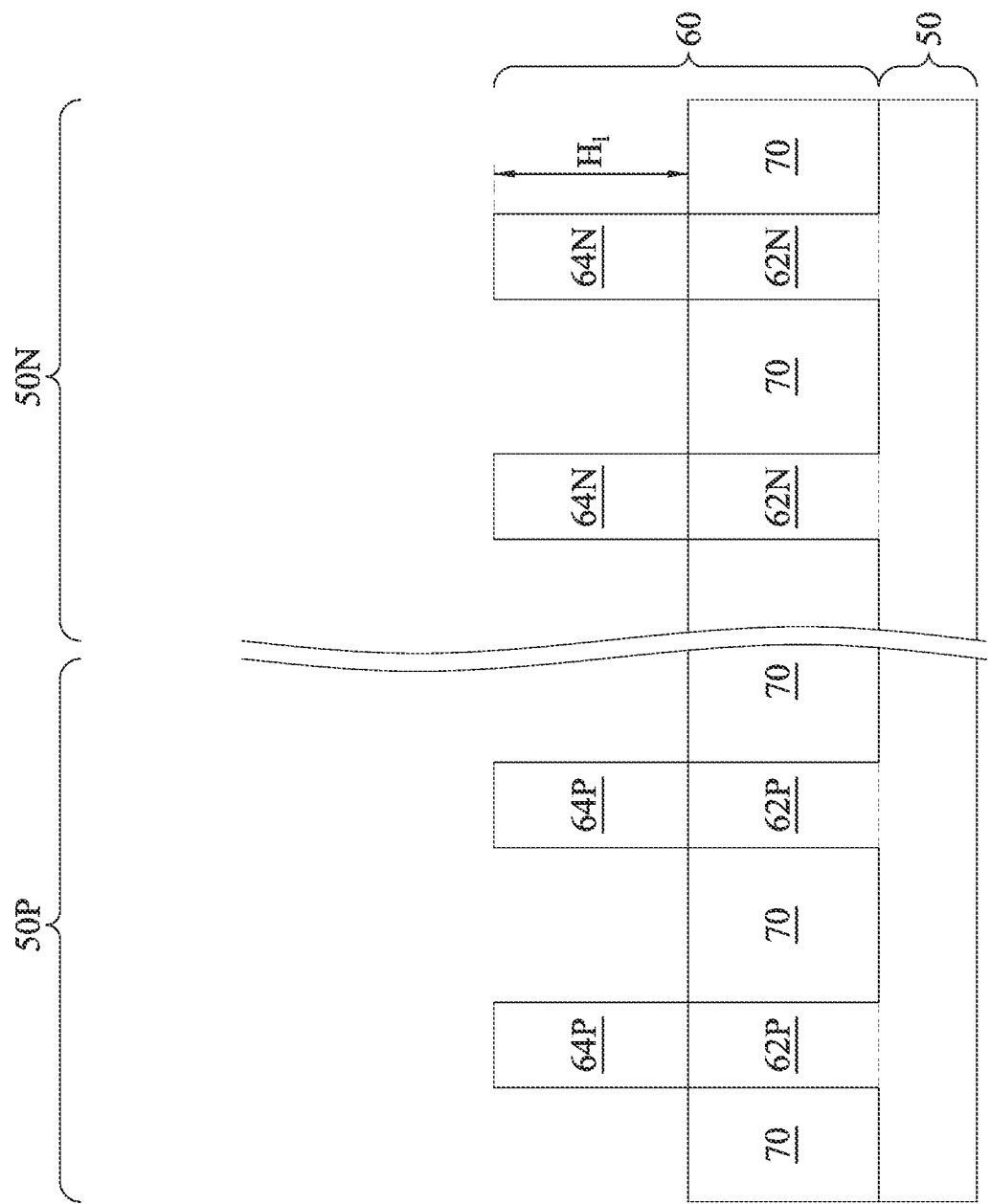

In FIG. 6, the insulation material 68 is recessed to form shallow trench isolation (STI) regions 70. The insulation material 68 is recessed such that the upper portions 64 of the fins 60 protrude from between neighboring STI regions 70. The insulation material 68 may be recessed by performing a planarization process followed by an acceptable etching process. In some embodiments, the planarization process includes a chemical mechanical polish (CMP), an etch back process, combinations thereof, or the like. The planarization process exposes the fins 60. Top surfaces of the fins 60 and the insulation material 68 are level after the planarization process. The STI regions 70 may then be recessed using an acceptable etching process, such as one that is selective to the material of the insulation material 68. For example, a chemical oxide removal using a hydrogen source (e.g., ammonia) with a fluorine source (e.g., nitrogen trifluoride), or a chemical oxide removal using dilute hydrofluoric (dHF) acid may be used. The top surfaces of the STI regions 70 may be formed flat, convex, and/or concave by the etching process. The exposed portions of the fins 60 have a first height Hi. In some embodiments, the first height Hi is in a range of 40 nm to 60 nm.

In the embodiment shown, top surfaces of the STI regions 70 are level with top surfaces of the lower portions 62 of the fins 60, such that the upper portions 64 of the fins 60 are completely exposed. In some embodiments, the top surfaces of the STI regions 70 are disposed above top surfaces of the lower portions 62 of the fins 60, such that the upper portions 64 of the fins 60 are partially exposed. In some embodiments, top surfaces of the STI regions 70 are disposed below top surfaces of the lower portions 62 of the fins 60, such that the upper portions 64 of the fins 60 are completely exposed and the lower portions 62 of the fins 60 are partially exposed.

In some embodiments, protective caps (not illustrated) are formed on the exposed portions of the fins 60. Germanium oxidizes more easily than silicon, and so the upper portions 64P of the fins 60, which may comprise germanium, are at a greater risk of oxidizing. Forming the protective caps may help avoid/reduce oxidation during subsequent processing. The protective caps may be a semiconductor material, such as silicon, silicon carbide, a III-V compound semiconductor, a II-VI compound semiconductor, or the like. In some embodiments, the protective caps are silicon and are epitaxially grown on the exposed portions of the fins 60.

FIGS. 7 through 10 illustrate the formation of a dummy dielectric layer 80 over the fins 60, in accordance with some embodiments. The dummy dielectric layer 80 comprises dielectric sublayers and has a greater thickness of dielectric material formed over the top of the fins 60 than over sidewalls of the fins 60 (see below, FIG. 10). The greater thickness on the top of the dummy dielectric layer 80 may reduce fin loss from the top surface of the fins 60 during subsequent removal processes of dummy gates formed over the fins 60 (see below, FIGS. 12A and 12B) without increasing the thickness of the dielectric sublayer 80A on sidewalls of the fins 60, which may lead to undesired merging of subsequently formed portions of the dummy dielectric layer 80 on adjacent fins 60 and/or undesired voids in subsequently formed portions of a dummy gate layer (see below, FIGS. 11A-11B) between adjacent fins 60.

Figure 7:
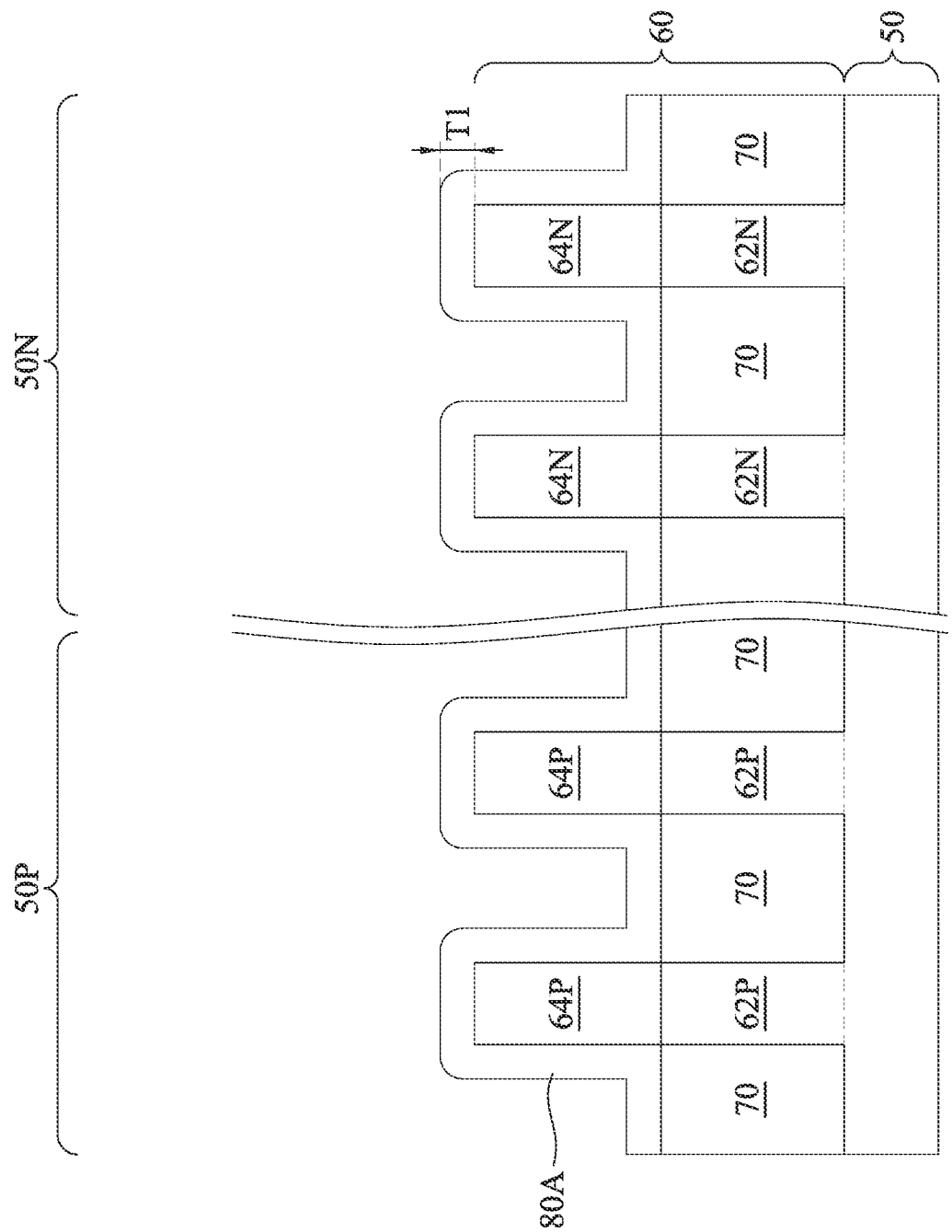

In FIG. 7, a first dielectric sublayer 80A is formed over the upper portions 64 of the fins 60 and over exposed portions of the STI regions 70. The first dielectric sublayer 80A may comprise the bulk of the portions of the subsequently formed dummy dielectric layer 80 on top surfaces of the fins 60. The first dielectric sublayer 80A may comprise one or more oxide (e.g., silicon oxide) and/or nitride (e.g., silicon nitride) layers and may be formed by a suitable process such as CVD, PECVD, PVD, ALD, PEALD, or the like. In some embodiments, the first dielectric sublayer 80A comprises silicon oxide and is formed by PEALD with a plasma generation power in a range of 15 W to 200 W. In some embodiments, the first dielectric sublayer 80A is formed to a first thickness T1 in a range of 15 Å to 35 Å, which is advantageous for reducing fin loss during a subsequent patterning process of a dummy gate (see below, FIGS. 12A-13B). Forming the first dielectric sublayer 80A to a thickness less than 15 Å may lead to undesired fin loss during the subsequent patterning process of the dummy gate. Forming the first dielectric sublayer 80A to a thickness greater than 35 Å may lead to undesired merging of subsequently formed portions of the dummy dielectric layer 80 on adjacent fins 60 and/or undesired voids in subsequently formed portions of a dummy gate layer (see below, FIGS. 11A-11B) between adjacent fins 60.

Following the formation of the first dielectric sublayer 80A, a plasma treatment (e.g. an O2 plasma treatment) may be performed on the first dielectric sublayer 80A. The plasma treatment may further oxidize the material of the first dielectric sublayer 80A, which may reduce fin loss during a subsequent patterning process of a dummy gate. The plasma treatment may be performed using a plasma generation power in a range of 400 W to 600 W.

Figure 8:
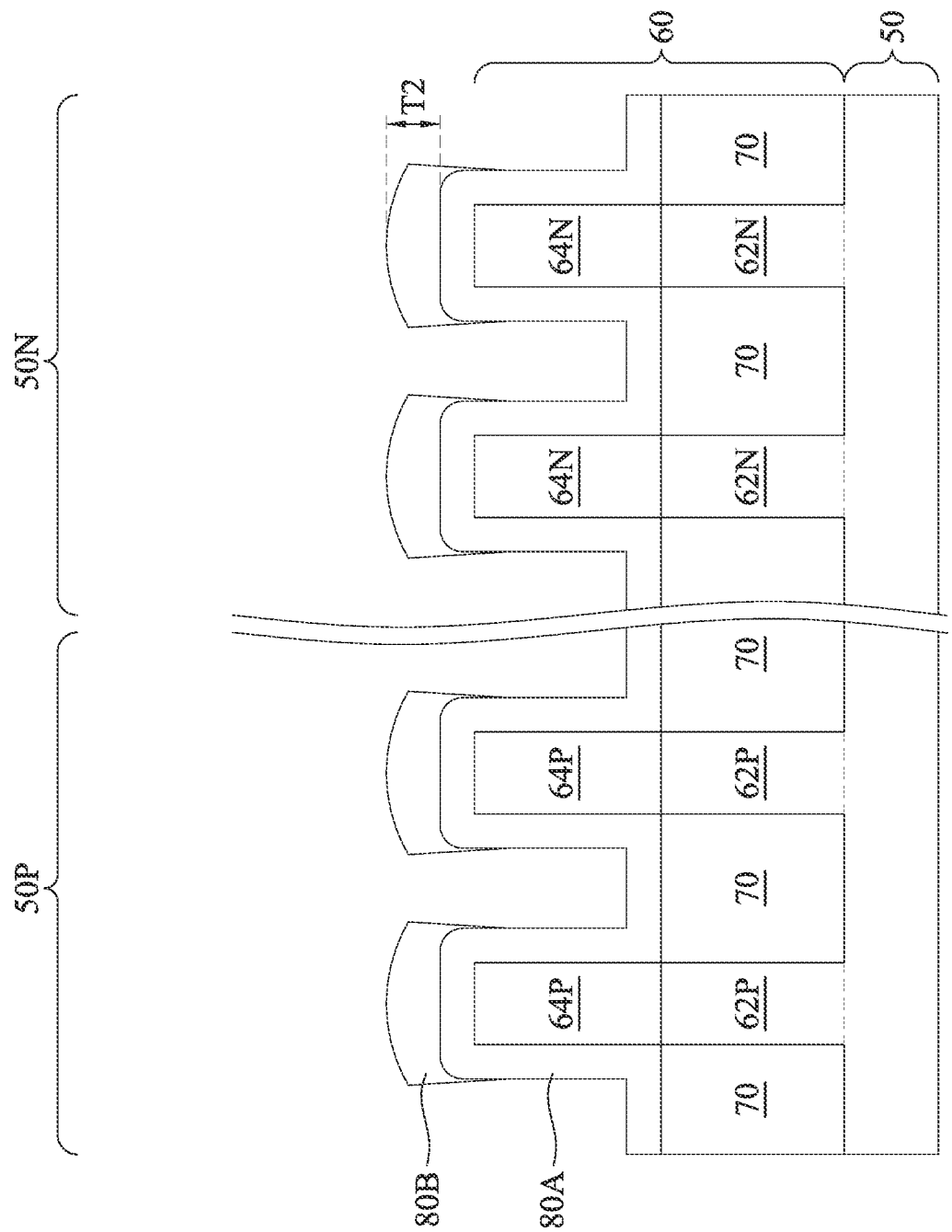

In FIG. 8, a mask sublayer 80B is formed on top surfaces of the first dielectric sublayer 80A over the fins 60. The mask sublayer 80B protects portions of the first dielectric sublayer 80A during a subsequent etch back process (see below, FIG. 9). The mask sublayer 80B is formed to cover top surfaces of the portions of the first dielectric sublayer 80A over the fins 60. In some embodiments, the mask sublayer 80B exposes top surfaces of portions of the first dielectric sublayer 80A on the STI regions 70. In some embodiments, sidewall portions of the mask sublayer 80B extend along upper portions of sidewalls of the first dielectric sublayer 80A. The sidewall portions of the mask sublayer 80B may taper in thickness along the upper portions of the sidewalls of the first dielectric sublayer 80A. For example, in embodiments such as that illustrated in FIG. 8, bottom portions of the sidewalls of the first dielectric sublayer 80A may be exposed, and a thickness of the mask sublayer 80B may taper, increasing in thickness as the mask sublayer 80B extends further from the substrate 50. In some embodiments in which the first dielectric sublayer 80A comprises, for example, silicon oxide, the mask sublayer 80B may comprise carbon and/or nitrogen and may be formed with a suitable process such as CVD, PECVD, PVD, ALD, PEALD, or the like. In embodiments such as these in which the first dielectric sublayer 80A comprises silicon oxide and the mask sublayer 80B comprises a nitride, carbide, or the like, the mask sublayer 80B has a lower etch rate than the first dielectric sublayer 80A, thereby acting as an etching mask in a subsequent etch back process in order to allow uncovered portions of the first dielectric sublayer 80A (e.g. on sidewalls of the fins 60) to be etched while protecting the top of the first dielectric sublayer 80A. For example, in some embodiments, the mask sublayer 80B is silicon nitride, silicon carbonitride, silicon oxycarbonitride, the like, or a combination thereof and is formed using Bis(diethylamino) silane (BDEAS), $SiH_3$—$N((CH$—$(CH_3)_2)_2$, the like, or a combination thereof as precursors.

In some embodiments, the mask sublayer 80B is formed with a suitable process such as ALD, the process having cycles with relatively high pressure, short purge time, and short plasma treatment time. The high pressure, short purge time, and short plasma treatment time may lead to less adsorption of precursors on sidewalls of the first dielectric sublayer 80A and more adsorption of precursors on top surfaces of the first dielectric sublayer 80A. This may lead to a profile of the mask sublayer 80B having more material on top surfaces of the first dielectric sublayer 80A than on sidewalls of the first dielectric sublayer 80A, e.g. a thickness of the mask sublayer 80B may taper, increasing in thickness as the mask sublayer 80B extends further from the substrate 50. In some embodiments, the ALD process utilizes multiple deposition cycles of alternating precursor gases. For example, the ALD process may be a cyclic deposition comprising, e.g., a first cycle using a first precursor such as Bis(diethylamino)silane (BDEAS) followed by a second cycle using a second precursor such as $SiH_3$—$N((CH$—$(CH_3)_2)_2$. In some embodiments, silicon and oxygen deposited by the first cycle may react with silicon, carbon, and nitrogen deposited by the second cycle, forming a material comprising silicon, oxygen, carbon, and nitrogen. Alternating first cycles and second cycles may be repeated until the mask sublayer reaches a desired thickness of, e.g., silicon oxycarbonitride. The mask sublayer 80B may be formed with a plasma generation power in a range of 15 W to 150 W. The mask sublayer 80B may be formed under a pressure in a range of 1500 torr to 3500 torr. The mask sublayer 80B may be formed with a purge time for each cycle of the ALD in a range of 0.05 s to 0.25 s and a plasma treatment time for each cycle of the ALD in a range of 0.05 s to 0.25 s.

In some embodiments, the mask sublayer 80B is formed to a second thickness T2 over top surfaces of the first dielectric sublayer 80A over the fins 60 in a range of 5 Å to 10 Å, which is advantageous for retaining sufficient thickness of the mask sublayer 80B after a subsequent etch back process to protect top portions of the first dielectric sublayer 80A. Forming the mask sublayer 80B to a thickness less than 5 Å may be disadvantageous by not providing sufficient thickness to protect top portions of the first dielectric sublayer 80A. Forming the mask sublayer 80B to a thickness greater than 10 Å may be disadvantageous by leading to undesired merging of subsequently formed portions of the dummy dielectric layer 80 on adjacent fins 60 and/or undesired voids in subsequently formed portions of a dummy gate layer (see below, FIGS. 11A-11B) between adjacent fins 60.

Figure 9:
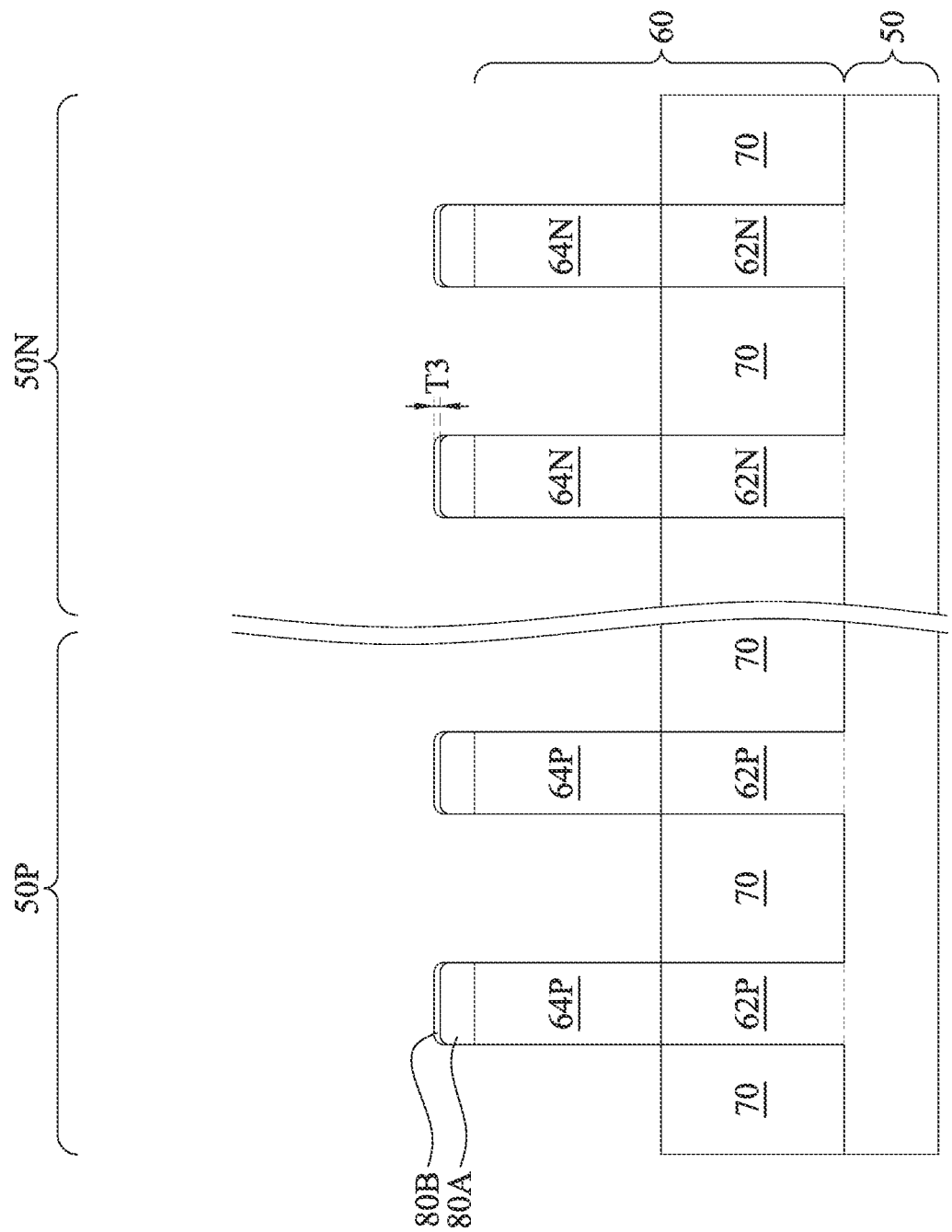

In FIG. 9, a patterning, such as an etch back process, is performed to remove portions of the first dielectric sublayer 80A and the mask sublayer 80B on sidewalls of the fins 60. By removing sidewall portions of the first dielectric sublayer 80A and the mask sublayer 80B, the etch back process may increase the process window for subsequent processes such as dummy gate layer formation between fins 60 by increasing a distance between adjacent structures (e.g., between adjacent fins). By increasing the distance, the likelihood of undesired merging of subsequently formed portions of the dummy dielectric layer 80 on adjacent fins 60 and/or undesired voids in subsequently formed portions of a dummy gate layer (see below, FIGS. 11A-11B) between adjacent fins 60 is reduced. The mask sublayer 80B acts as an etch stop layer to protect top portions of the first dielectric sublayer 80A on top surfaces of the fins 60 from the etch back process. The etch back process may be a cyclic etch comprising wet etch processes, dry etch processes, or a combination thereof. In some embodiments, the etch back process comprises a wet etch using dilute hydrofluoric acid, hydrochloric acid, the like, or a combination thereof as etchants. In some embodiments, the etch back process comprises a dry etch using $NH_3$, HF, the like, or a combination thereof as etchants. The etch back process may be halted when the sidewall portions of the first dielectric sublayer 80A are removed, exposing sidewalls of the upper portions 64 of the fins 60.

After the etch back process, top portions of the first dielectric sublayer 80A remain on top surfaces of the fins 60, covered by remaining portions of the mask sublayer 80B. In some embodiments, the remaining portions of the mask sublayer 80B have a third thickness T3 in a range of 2 Å to 5 Å, which is advantageous for the etch back process removing sidewall portions of the first dielectric sublayer 80A and the mask sublayer 80B. The remaining portions of the mask sublayer 80B having a thickness less than 2 Å may lead to etching of the first dielectric sublayer 80A, which may cause undesired subsequent fin loss. The remaining portions of the mask sublayer 80B having a thickness greater than 5 Å may lead to sidewall portions of the first dielectric sublayer 80A remaining on the fins 60, which may decrease the process window for subsequent processes such as dummy gate formation.

Figure 10:
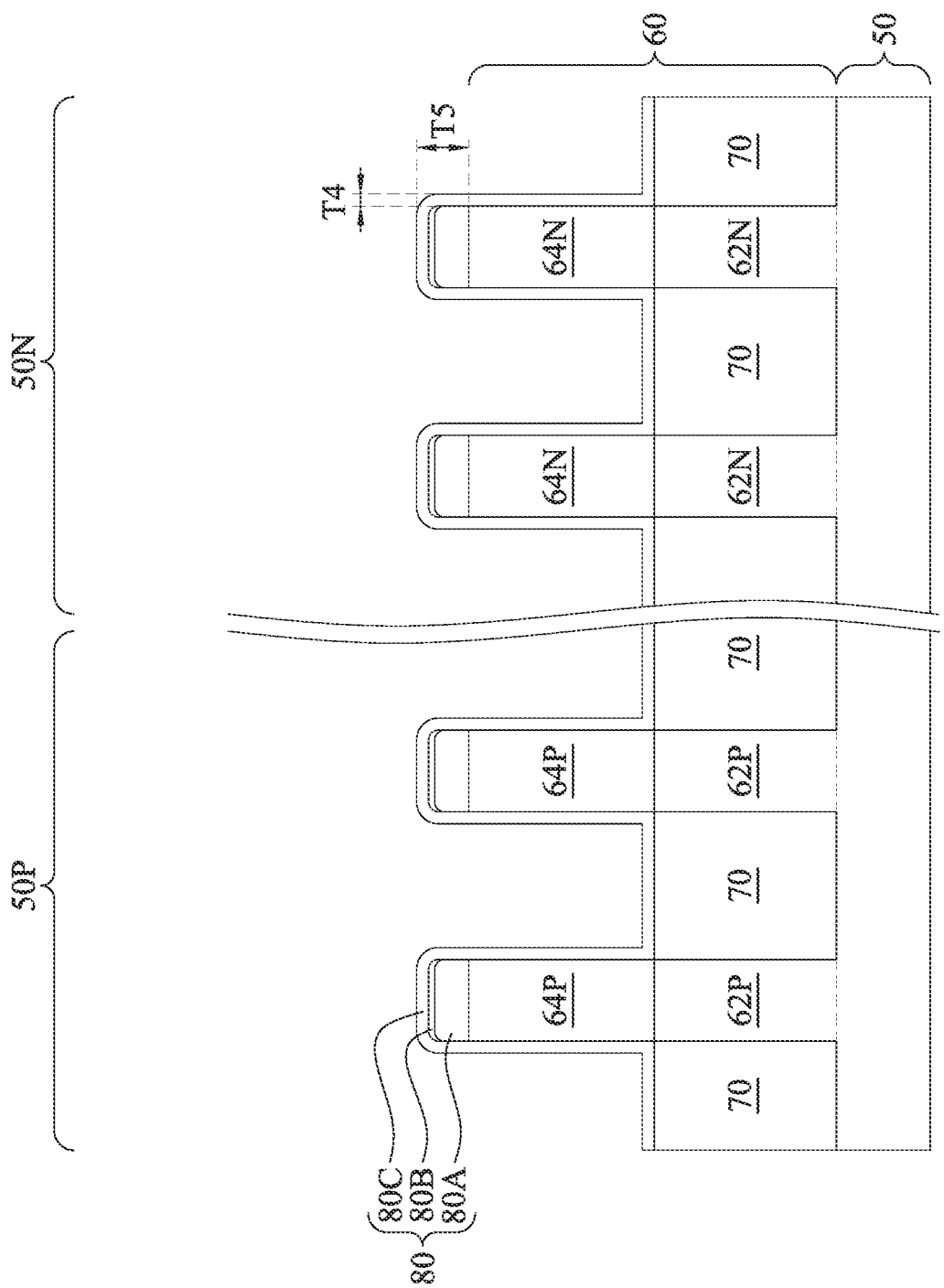

In FIG. 10, a second dielectric sublayer 80C is formed over the upper portions 64 of the fins 60 and over exposed portions of the STI regions 70, covering the remaining portions of the first dielectric sublayer 80A and the mask sublayer 80B. The remaining portions of the first dielectric sublayer 80A and the mask sublayer 80B and the second dielectric sublayer 80C together form a dummy dielectric layer 80 with a greater thickness of dielectric material formed over the top of the fins 60 than over sidewalls of the fins 60. This may reduce fin loss from the top surface of the fins 60 during subsequent removal processes of dummy gates formed over the fins 60 (see below, FIGS. 12A and 12B). In some embodiments, the second dielectric sublayer 80C is formed of similar materials and by similar methods as the first dielectric sublayer 80A (see above, FIG. 7). It is noted that the second dielectric sublayer 80C is shown covering the STI regions 70 for illustrative purposes only. In some embodiments, the second dielectric sublayer 80C covers only the fins 60.

In some embodiments, the second dielectric sublayer 80C is formed to a fourth thickness T4 in a range of 15 Å to 35 Å on sidewalls and over top surfaces of the fins 60, which is advantageous for reducing fin loss during a subsequent patterning process of a dummy gate (see below, FIGS. 12A-13B). Forming the second dielectric sublayer 80C to a thickness less than 15 Å may lead to undesired fin loss during the subsequent patterning process of the dummy gate. Forming the second dielectric sublayer 80C to a thickness greater than 35 Å may lead to undesired merging of portions of the second dielectric sublayer 80C on adjacent fins 60 and/or undesired voids in subsequently formed portions of a dummy gate layer (see below, FIGS. 11A-11B) between adjacent fins 60.

In some embodiments, the dummy dielectric layer 80 has a fifth thickness T5 measured between a top surface of the fins 60 and a top surface of the dummy dielectric layer 80 over the fins 60 in a range of 45 Å to 65 Å, which is advantageous for reducing fin loss during a subsequent patterning process of a dummy gate (see below, FIGS. 12A-13B). The dummy dielectric layer 80 having a fifth thickness T5 less than 45 Å may lead to undesired fin loss during the subsequent patterning process of the dummy gate. The dummy dielectric layer 80 having a fifth thickness T5 greater than 65 Å may decrease the process window for subsequent processes such as dummy gate formation.

In some embodiments, the ratio of the fifth thickness T5 to the fourth thickness T4 is in a range of 2:1 to 5:1, which may be advantageous for reducing fin loss from the top surfaces of the fins 60 while increasing the process window for subsequent processes such as dummy gate formation. The ratio of the fifth thickness T5 to the fourth thickness T4 being less than 2:1 may lead to undesired fin loss from the top surfaces of the fins 60 or to a decrease in the process window for subsequent processes such as dummy gate formation. The ratio of the fifth thickness T5 to the fourth thickness T4 being greater than 5:1 may lead to undesired fin loss on sidewalls of the fins 60 during a subsequent removal process of the dummy dielectric layer 80 (see below, FIGS. 20A-20B).

Figure 11A:
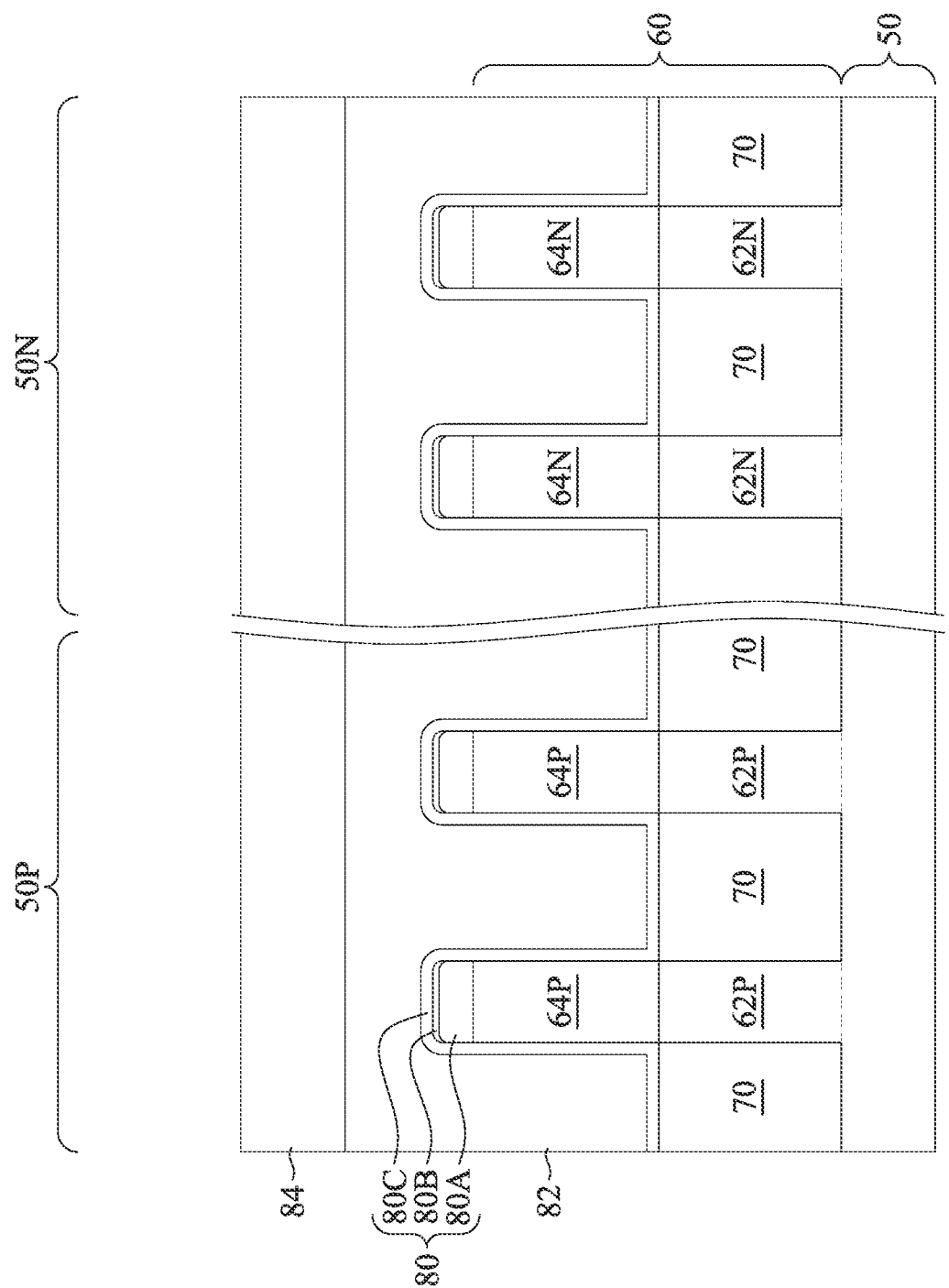
Figure 11B:
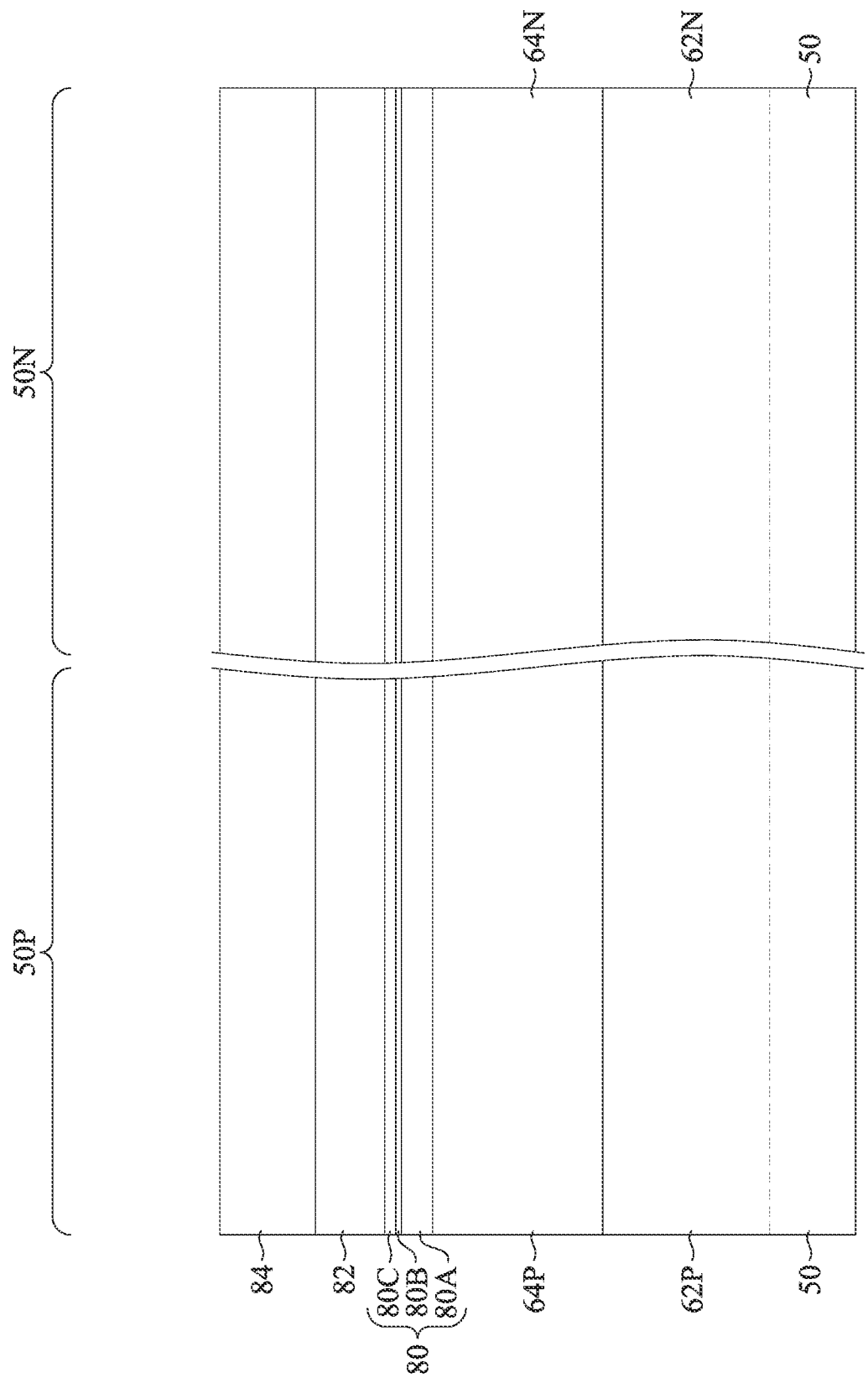

In FIGS. 11A and 11B, a dummy gate layer 82 is formed over the dummy dielectric layer 80, and a mask layer 84 is formed over the dummy gate layer 82. The dummy gate layer 82 may be deposited over the dummy dielectric layer 80 and then planarized, such as by a CMP. The mask layer 84 may be deposited over the dummy gate layer 82. The dummy gate layer 82 may be a conductive or semiconductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 82 may be deposited by physical vapor deposition (PVD), CVD, sputter deposition, or other techniques for depositing the selected material. The dummy gate layer 82 may be made of other materials that have a high etching selectivity from the etching of isolation region, e.g., the STI regions 70 and/or the dummy dielectric layer 80. The mask layer 84 may include one or more layers of, for example, silicon nitride, silicon oxynitride, or the like. In this example, a single dummy gate layer 82 and a single mask layer 84 are formed across the n-type region 50N and the p-type region 50P.

FIGS. 12A through 23B illustrate various additional steps in the manufacturing of embodiment devices. Although FIGS. 12A through 23B illustrate features in the p-type region 50P, it should be appreciated that the structures illustrated may be applicable to both the n-type region 50N and the p-type region 50P. Differences (if any) in the structures of the n-type region 50N and the p-type region 50P are described in the text accompanying each figure.

Figures 12A, 12B:
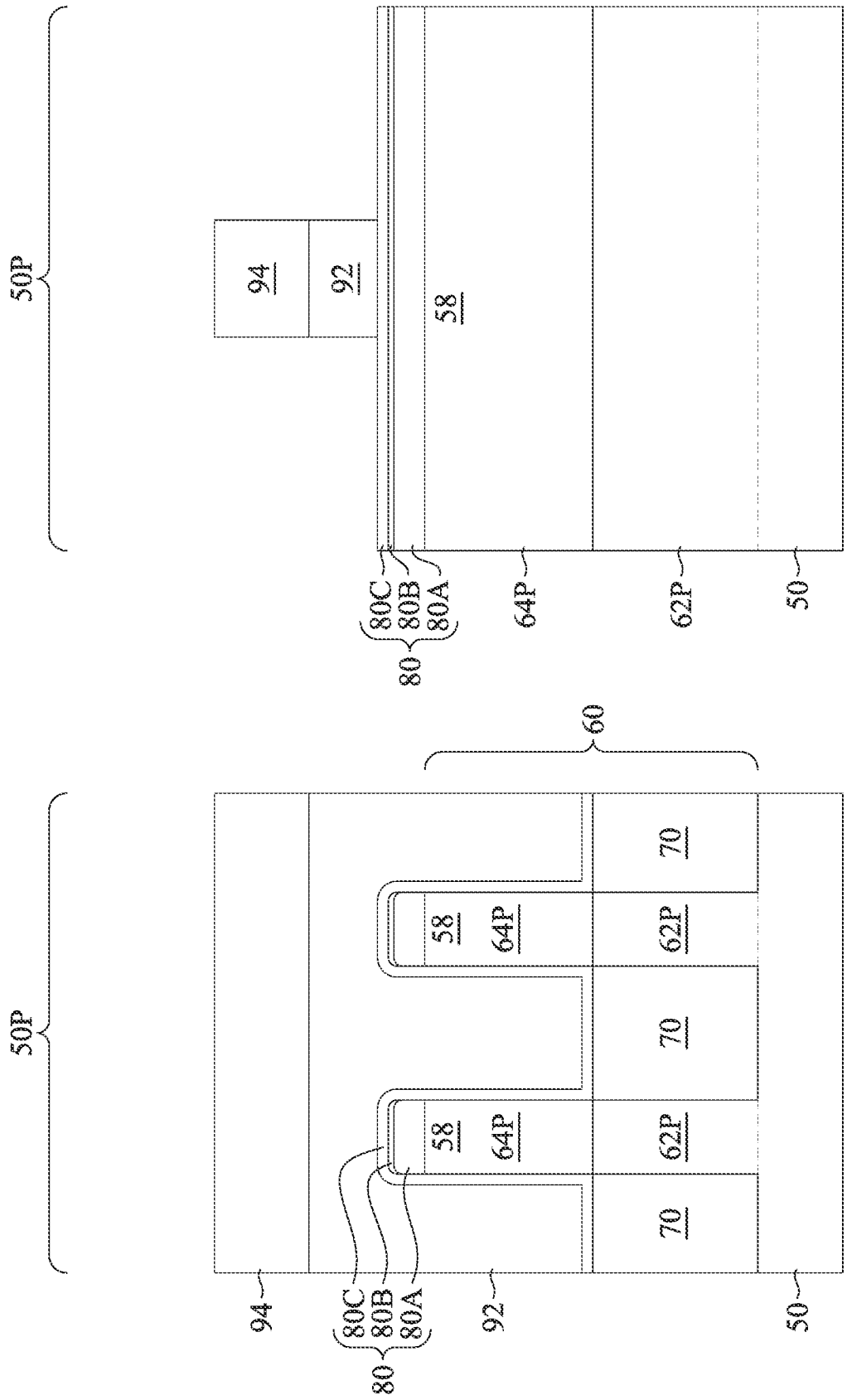

In FIGS. 12A and 12B, the mask layer 84 (see above, FIGS. 11A-11B) may be patterned using acceptable photolithography and etching techniques to form masks 94. The pattern of the masks 94 then may be transferred to the dummy gate layer 82 to form dummy gates 92. The dummy gates 92 cover respective channel regions 58 of the fins 60. The pattern of the masks 94 may be used to physically separate each of the dummy gates 92 from adjacent dummy gates. The dummy gates 92 may also have a lengthwise direction substantially perpendicular to the lengthwise direction of respective fins 60.

Figure 13B:
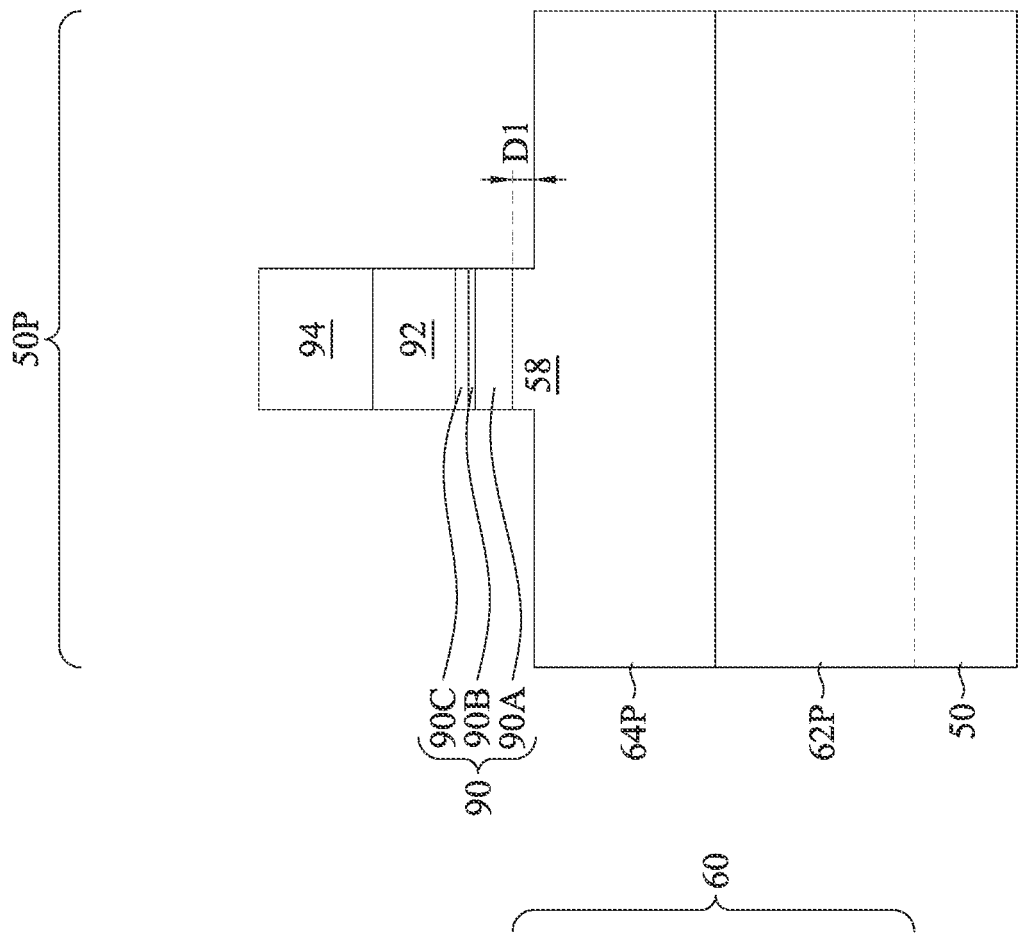
Figure 13A:
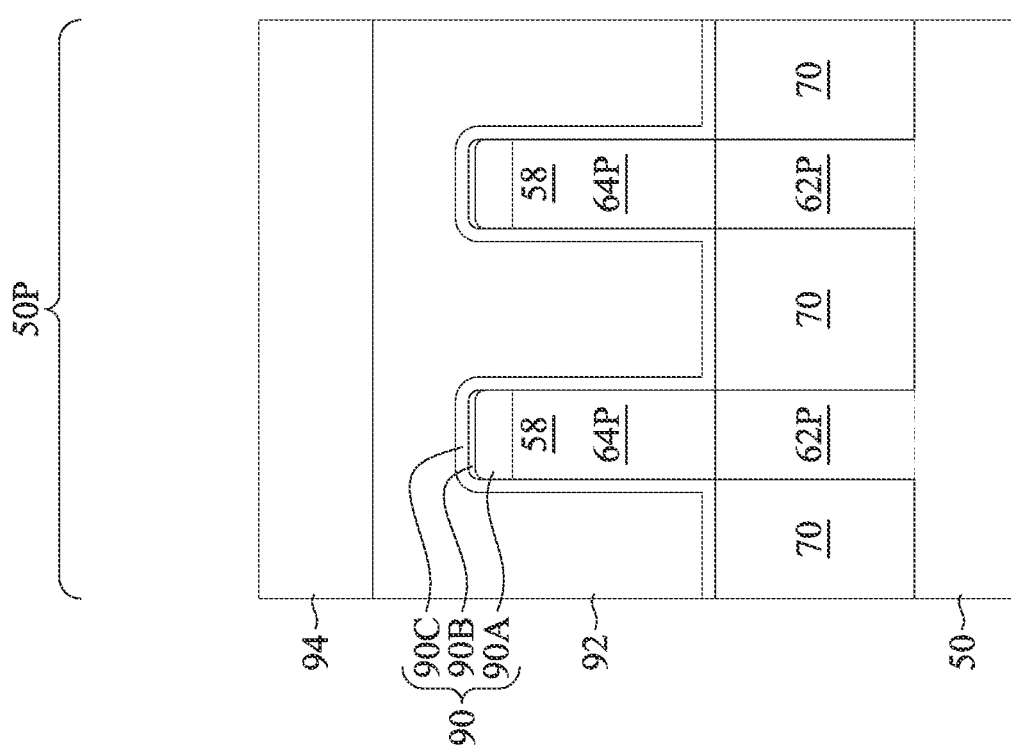

In FIGS. 13A and 13B, the pattern of the masks 94 and dummy gates 92 is transferred to the dummy dielectric layer 80 by an acceptable etching technique to form a dummy gate dielectric layer 90. In some embodiments, the dummy gate dielectric layer 90 is formed by an etch process comprising a wet etch process, a dry etch processes, or a combination thereof. In some embodiments, the etch process comprises a wet etch using dilute hydrofluoric acid, hydrochloric acid, the like, or a combination thereof as etchants. In some embodiments, the etch process comprises a dry etch using $NH_3$, HF, the like, or a combination thereof as etchants. In some embodiments in which the respective materials of the first dielectric sublayer 80A, the mask sublayer 80B, and the second dielectric sublayer 80C have different etch selectivities, the etch process may comprise a first etchant such as $O_2$, HBr, or the like selected to etch the material of the first dielectric sublayer 80A, a second etchant such as $O_2$, HBr, or the like selected to etch the material of the mask sublayer 80B, and a third etchant such as $O_2$, HBr or the like selected to etch the material of the second dielectric sublayer 80C. In some embodiments, the material of the first dielectric sublayer 80A is the same as the material of the second dielectric sublayer 80C and the first etchant is the same as the third etchant.

The upper portions 64 of the fins 60 may be etched by a distance D1 in a range of 1 nm to 2 nm due to the thickness T5 of the dummy dielectric layer 80 (see above, FIG. 10) covering the upper portions 64 of the fins 60. The fin loss of a distance D1 on the upper portions 64 of the fins 60 may be smaller than a respective fin loss occurring with a smaller thickness of the dummy dielectric layer 80 over the upper portions 64 of the fins 60. This may boost device performance by reducing contact resistance.

In FIGS. 14A and 14B, gate seal spacers 96 are formed on exposed surfaces of the dummy gates 92, the masks 94, the dummy gate dielectric layer 90, and/or the fins 60. A thermal oxidation or a deposition followed by an anisotropic etch may form the gate seal spacers 96. In the illustrated embodiment, the gate seal spacers 96 are formed by a thermal oxidation of sidewall portions of the dummy gates 92, the masks 94, the dummy gate dielectric layer 90, and the fins 60. The gate seal spacers 96 may be formed of silicon oxide, silicon nitride, silicon oxynitride, or the like.

In FIGS. 15A and 15B, implants for lightly doped source/drain (LDD) regions 98 are performed. In the embodiments with different device types, similar to the implants discussed above in FIG. 2, a mask, such as a photoresist, may be formed over the n-type region 50N, while exposing the p-type region 50P, and appropriate type (e.g., p-type) impurities may be implanted into the exposed fins 60 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 60 in the n-type region 50N. The mask may then be removed. The n-type impurities may be any of the n-type impurities previously discussed, and the p-type impurities may be any of the p-type impurities previously discussed. The lightly doped source/drain regions may have a concentration of impurities of about $10^{15}$ cm$^{-3}$ to about $10^{19}$ cm$^{-3}$. An anneal may be used to repair implant damage and to activate the implanted impurities.

Figures 16A, 16B:
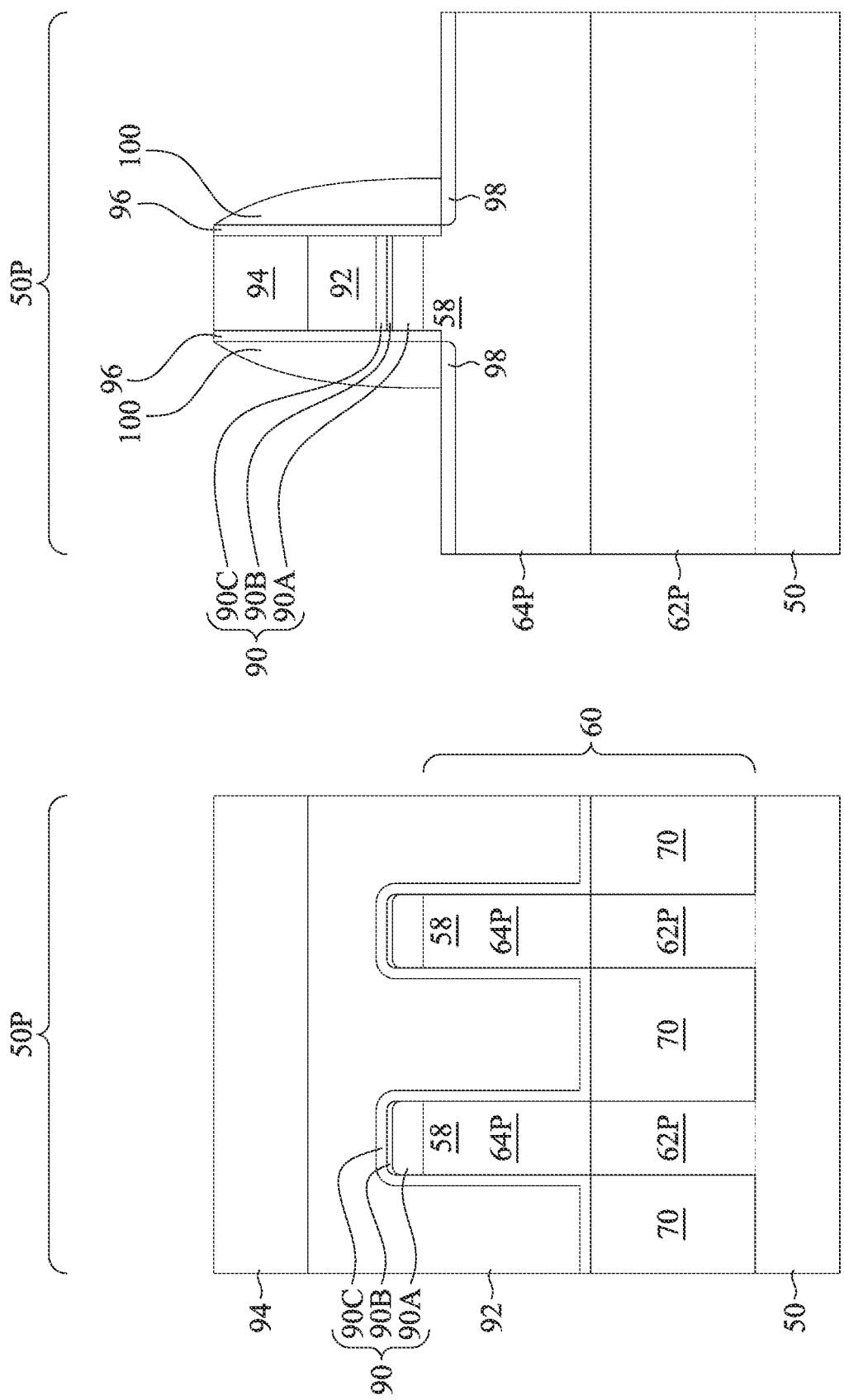
Figure 17D:
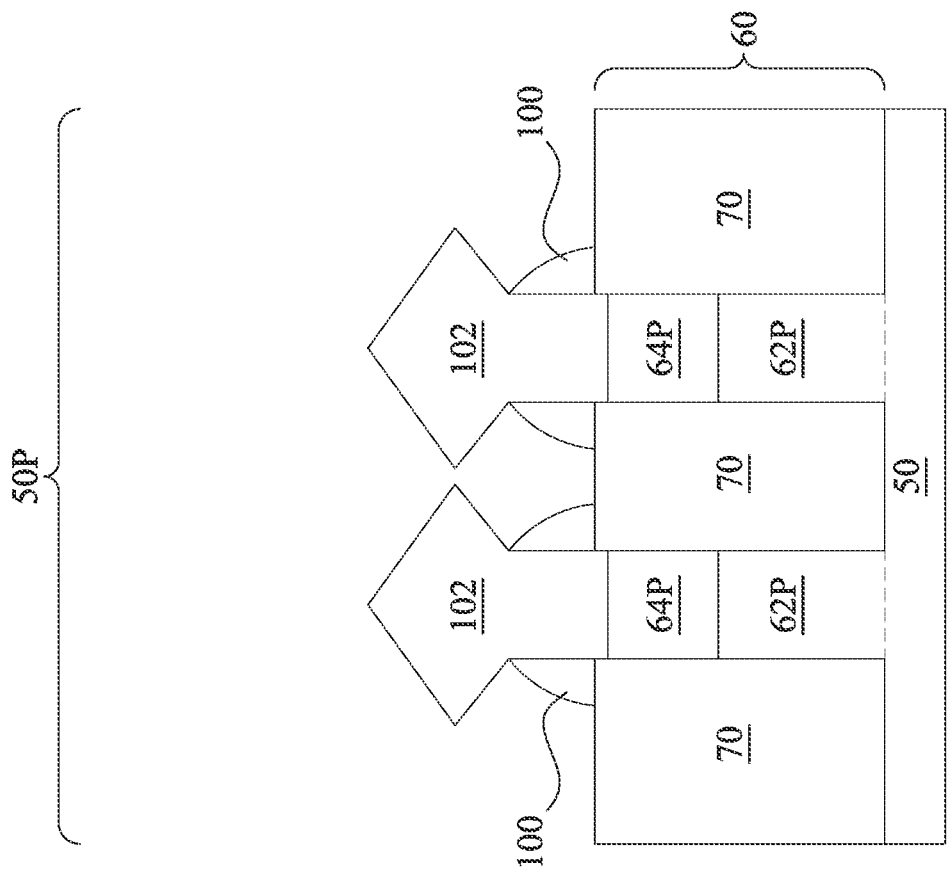
Figure 17C:
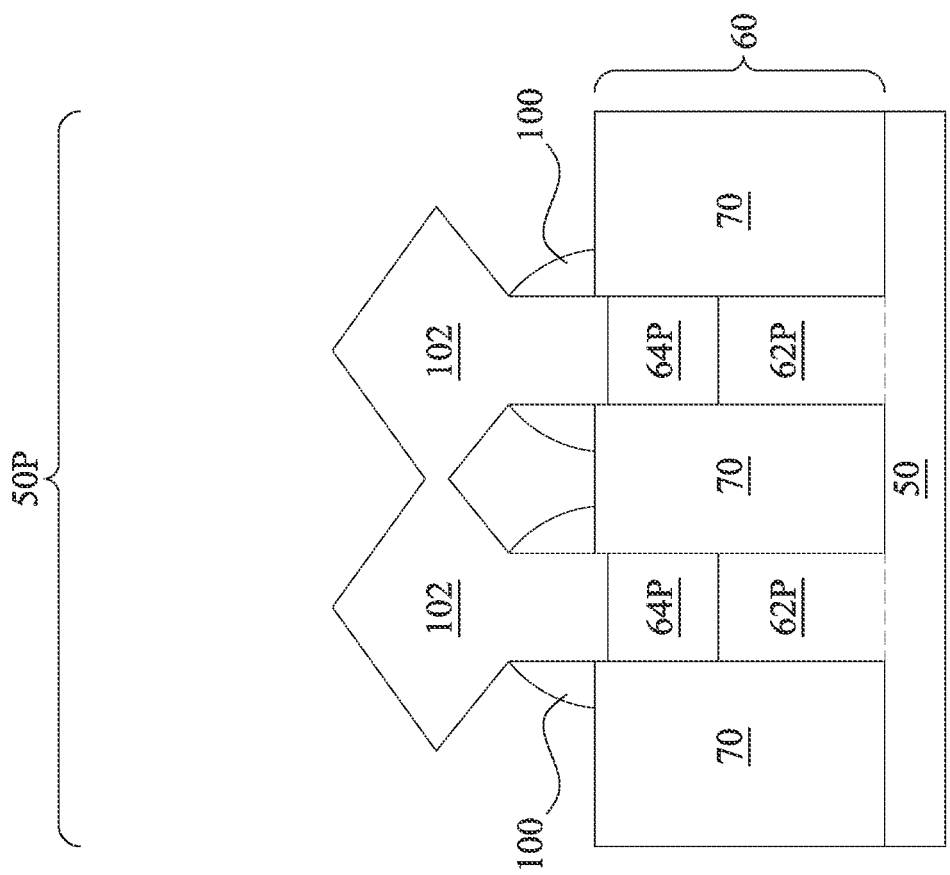

In FIGS. 16A and 16B, gate spacers 100 are formed on the gate seal spacers 96 along sidewalls of the dummy gates 92 and the masks 94. The gate spacers 100 may be formed by conformally depositing an insulating material and subsequently anisotropically etching the insulating material. The insulating material of the gate spacers 100 may be silicon oxide, silicon nitride, silicon oxynitride, silicon carbonitride, a combination thereof, or the like. The gate spacers 100 extend over upper portions 64 of the fins 60.

It is noted that the above disclosure generally describes a process of forming spacers and LDD regions. Other processes and sequences may be used. For example, fewer or additional spacers may be utilized, different sequence of steps may be utilized (e.g., the gate seal spacers 96 may not be etched prior to forming the gate spacers 100, yielding "L-shaped" gate seal spacers, spacers may be formed and removed, and/or the like). Furthermore, the n-type and p-type devices may be formed using a different structures and steps. For example, LDD regions for n-type devices may be formed prior to forming the gate seal spacers 96 while the LDD regions or p-type devices may be formed after forming the gate seal spacers 96.

In FIGS. 17A and 17B epitaxial source/drain regions 102 are formed in the fins 60. The epitaxial source/drain regions 102 are formed in the fins 60 such that each dummy gate 92 is disposed between respective neighboring pairs of the epitaxial source/drain regions 102. In some embodiments the epitaxial source/drain regions 102 may extend into, and may also penetrate through, the fins 60. In some embodiments, the gate spacers 100 are used to separate the epitaxial source/drain regions 102 from the dummy gates 92 and the dummy gate dielectric layer 90 by an appropriate lateral distance so that the epitaxial source/drain regions 102 do not short out subsequently formed gates of the resulting FinFETs. A material of the epitaxial source/drain regions 102 may be selected to exert stress in the respective channel regions 58, thereby improving performance.

The epitaxial source/drain regions 102 in the p-type region 50P, e.g., the PMOS region, may be formed by masking the n-type region 50N, e.g., the NMOS region, and etching source/drain regions of the fins 60 in the p-type region 50P to form recesses in the fins 60. Then, the epitaxial source/drain regions 102 in the p-type region 50P are epitaxially grown in the recesses. The epitaxial source/drain regions 102 may include any acceptable material, such as appropriate for p-type FinFETs. For example, if the fin 60 is silicon-germanium, the epitaxial source/drain regions 102 in the p-type region 50P may include materials exerting a tensile strain in the channel region 58, such as silicon-germanium, boron doped silicon-germanium, germanium, germanium tin silicon, or the like. The epitaxial source/drain regions 102 in the p-type region 50P may have surfaces raised from respective surfaces of the fins 60 and may have facets.

The epitaxial source/drain regions 102 in the n-type region 50N, e.g., the NMOS region, may be formed by masking the p-type region 50P, e.g., the NMOS region, and etching source/drain regions of the fins 60 in the n-type region 50N to form recesses in the fins 60. Then, the epitaxial source/drain regions 102 in the n-type region 50N are epitaxially grown in the recesses. The epitaxial source/drain regions 102 may include any acceptable material, such as appropriate for FinFETs. For example, if the fin 60 is silicon, the epitaxial source/drain regions 102 in the n-type region 50N may comprise materials exerting a compressive strain in the channel region 58, such as silicon carbide, phosphorous doped silicon carbide, silicon phosphide, or the like. The epitaxial source/drain regions 102 in the n-type region 50N may have surfaces raised from respective surfaces of the fins 60 and may have facets.

The epitaxial source/drain regions 102 and/or the fins 60 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 102 may be in situ doped during growth.

As a result of the epitaxy processes used to form the epitaxial source/drain regions 102 in the n-type region 50N and the p-type region 50P, upper surfaces of the epitaxial source/drain regions 102 have facets which expand laterally outward beyond sidewalls of the fins 60. In some embodiments, these facets cause adjacent source/drain regions 102 of a same FinFET to merge as illustrated by FIG. 17C. In other embodiments, adjacent source/drain regions 102 remain separated after the epitaxy process is completed as illustrated by FIG. 17D. In the embodiments illustrated in FIGS. 17C and 17D, gate spacers 100 are formed covering a portion of the sidewalls of the fins 60 that extend above the STI regions 70 thereby blocking the epitaxial growth. In some other embodiments, the spacer etch used to form the gate spacers 100 may be adjusted to remove the spacer material to allow the epitaxially grown region to extend to the surface of the STI region 70.

Figures 18A, 18B:
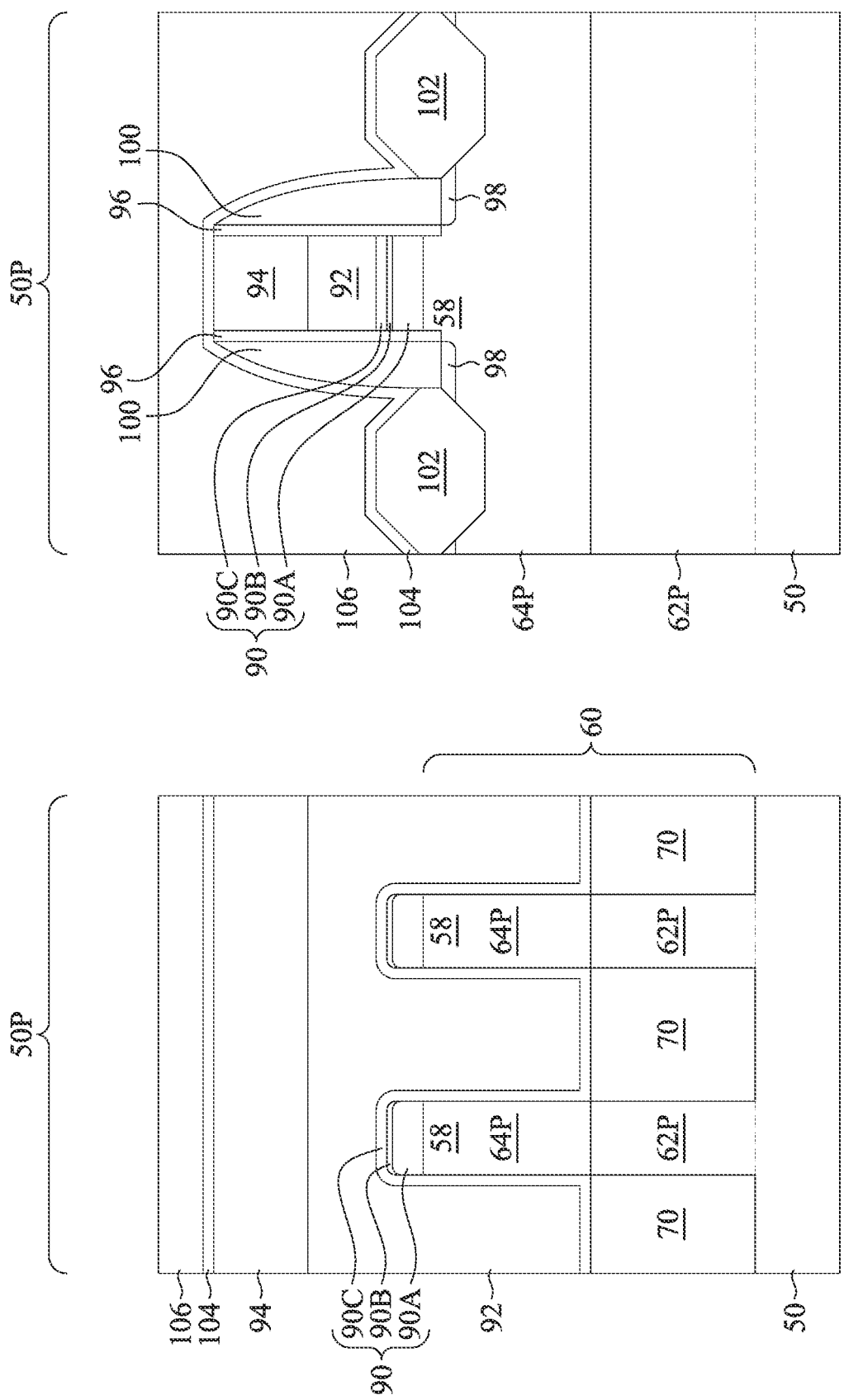

In FIGS. 18A and 18B, a first interlayer dielectric (ILD) 106 is deposited over the structure illustrated in FIGS. 17A and 17B. The first ILD 106 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 104 is disposed between the first ILD 106 and the epitaxial source/drain regions 102, the masks 94, and the gate spacers 100. The CESL 104 may comprise a dielectric material, such as, silicon nitride, silicon oxide, silicon oxynitride, or the like, having a lower etch rate than the material of the overlying first ILD 106.

Figure 19B:
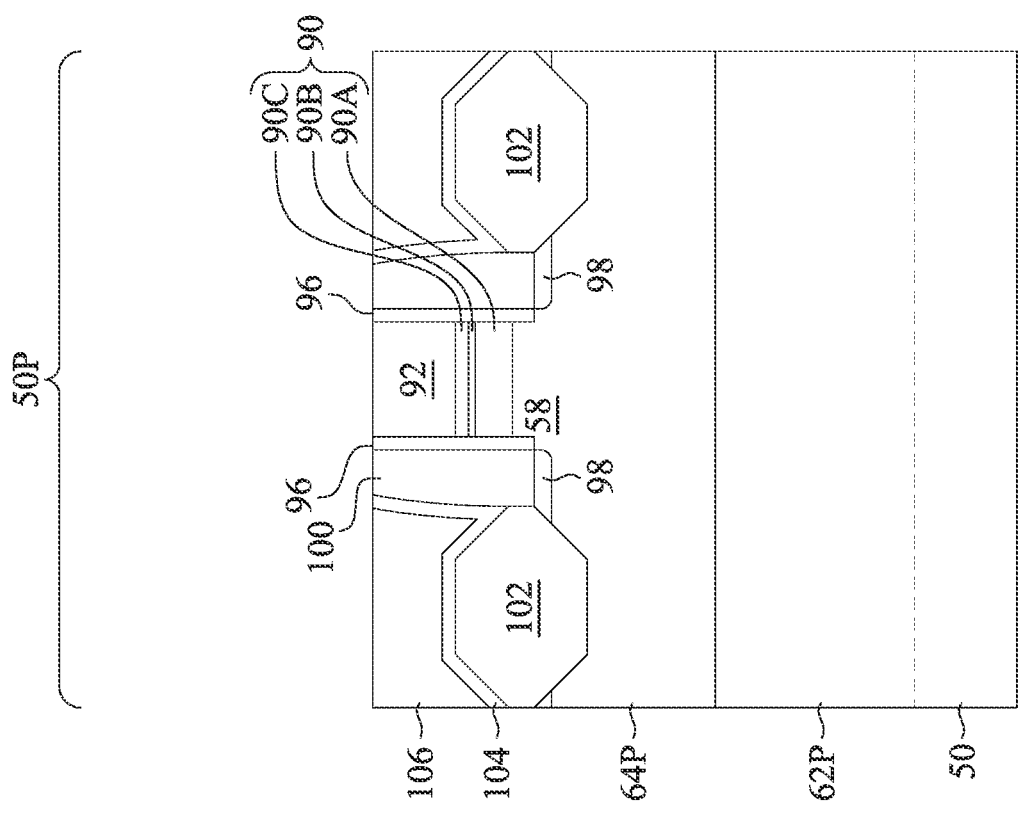
Figure 19A:
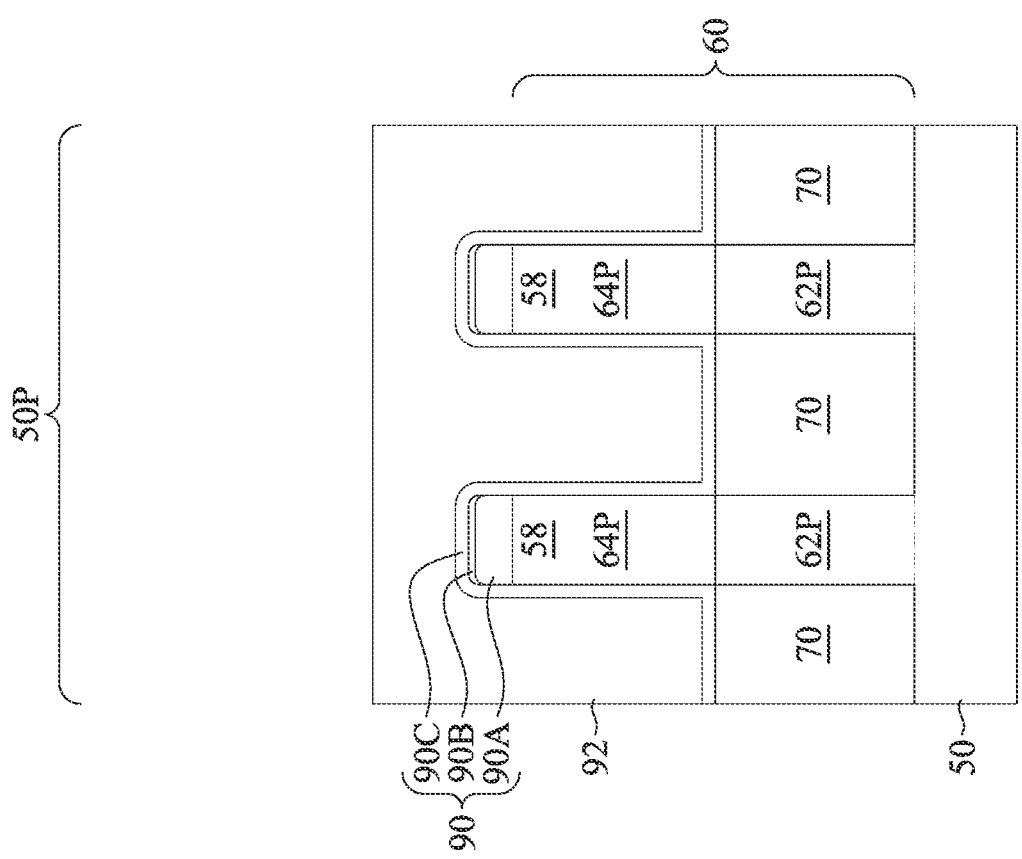

In FIGS. 19A and 19B, a planarization process, such as a CMP, may be performed to level the top surface of the first ILD 106 with the top surfaces of the dummy gates 92 or the masks 94 (see above, FIGS. 15A-15B). The planarization process may also remove the masks 94 on the dummy gates 92, and portions of the gate seal spacers 96 and the gate spacers 100 along sidewalls of the masks 94. After the planarization process, top surfaces of the dummy gates 92, the gate seal spacers 96, the gate spacers 100, and the first ILD 106 are level. Accordingly, the top surfaces of the dummy gates 92 are exposed through the first ILD 106. In some embodiments, the masks 94 may remain, in which case the planarization process levels the top surface of the first ILD 106 with the top surfaces of the masks 94.

FIGS. 20A through 24D illustrate various additional steps in the manufacturing of embodiment devices in a first region 500 of a die (e.g., a core logic region) and in a second region 600 of a die (e.g., an input/output region). FIGS. 20A, 20B, 21A, 21B, 21C, 22A, 22B, 23A, 23B, 24A, and 24B illustrate the first region 500, and FIGS. 20C, 20D, 21D, 21E, 21F, 22C, 22D, 23C, 23D, 24C, and 24D illustrate the second region 600.

Figure 20D:
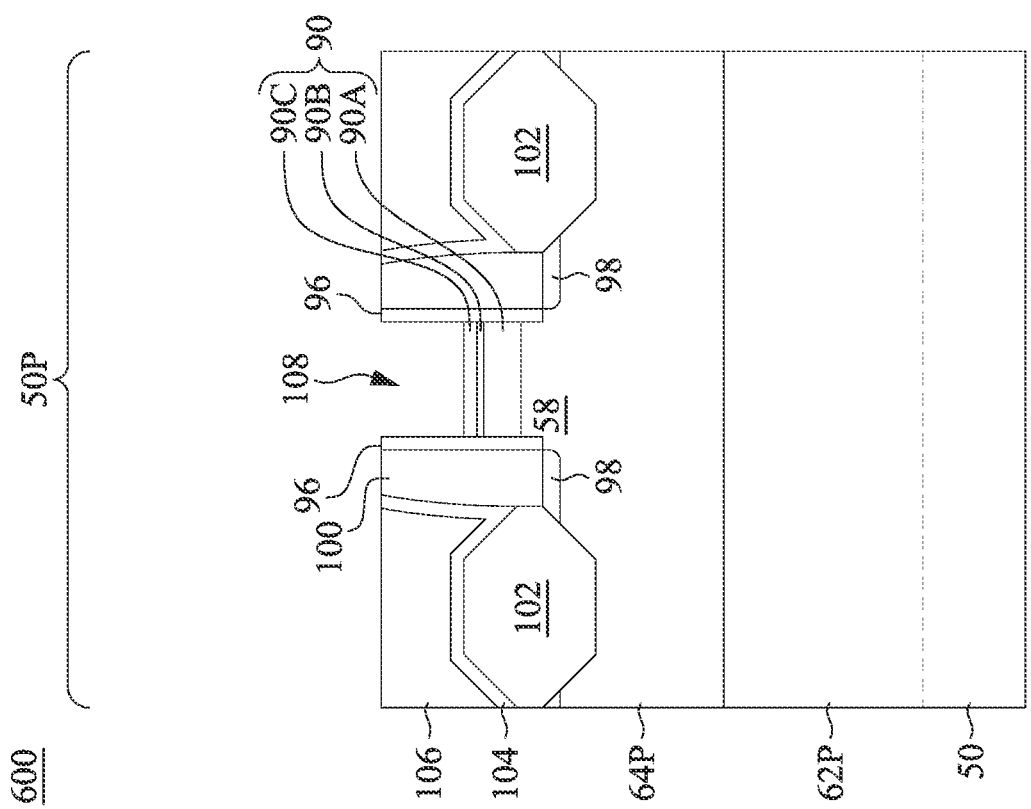
Figure 20C:
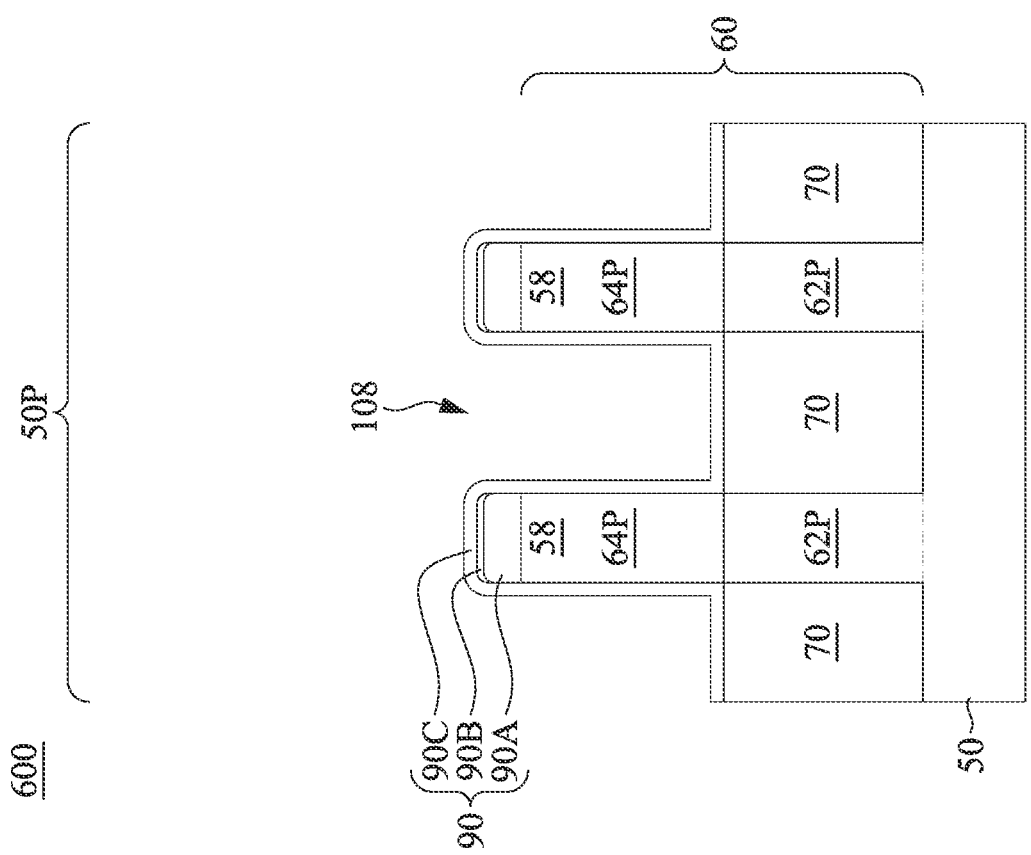

In FIGS. 20A through 20D, the dummy gates 92, and the masks 94 if present, are removed in an etching step(s), so that recesses 108 are formed. Portions of the dummy gate dielectric layer 90 in the recesses 108 may also be removed. In some embodiments, only the dummy gates 92 are removed and the dummy gate dielectric layer 90 remains and is exposed by the recesses 108. In some embodiments, the dummy gate dielectric layer 90 is removed from recesses 108 in a first region 500 of a die (e.g., a core logic region) and remains in recesses 108 in a second region 600 of the die (e.g., an input/output region). In some embodiments, the dummy gates 92 are removed by an anisotropic dry etch process. For example, the etching process may include a dry etch process using reaction gas(es) that selectively etch the dummy gates 92 with little or no etching of the first ILD 106 or the gate spacers 100. Each recess 108 exposes and/or overlies a channel region 58 of a respective fin 60. Each channel region 58 is disposed between neighboring pairs of the epitaxial source/drain regions 102. During the removal, the dummy gate dielectric layer 90 may be used as an etch stop layer when the dummy gates 92 are etched. The dummy gate dielectric layer 90 may then be removed in the first region 500 after the removal of the dummy gates 92 as illustrated in FIGS. 20A-B and may remain in the second region 600 as illustrated in FIGS. 20C-D. Various masking steps may be used to mask and expose appropriate regions when using distinct processes.

Figure 21C:
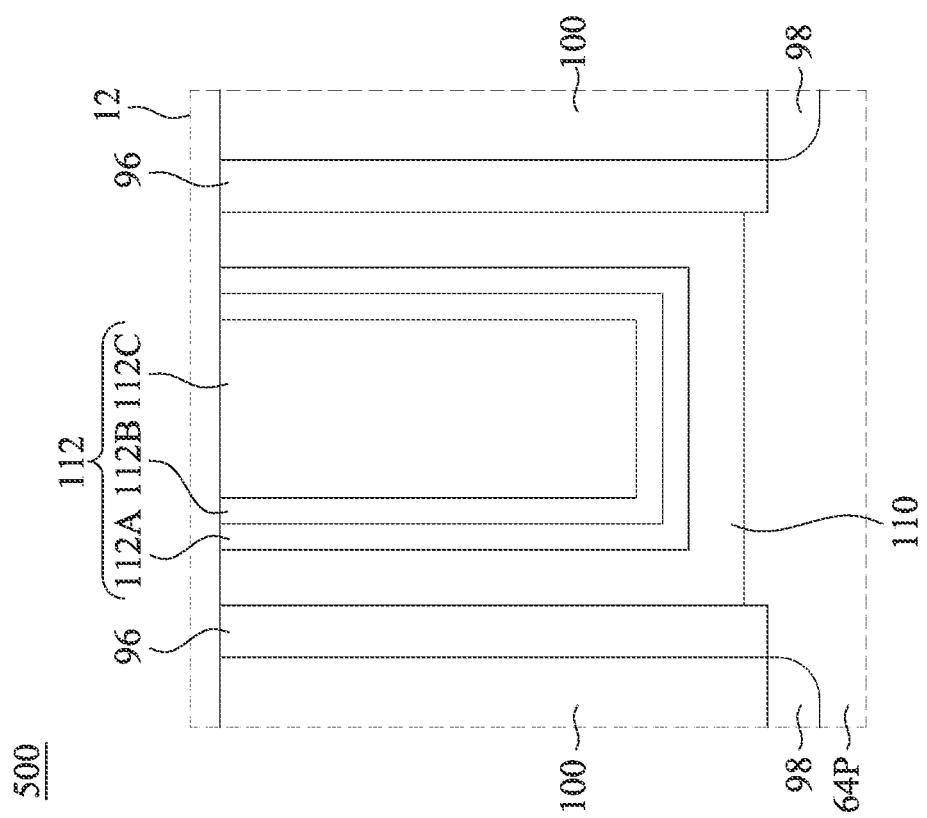
Figure 21F:
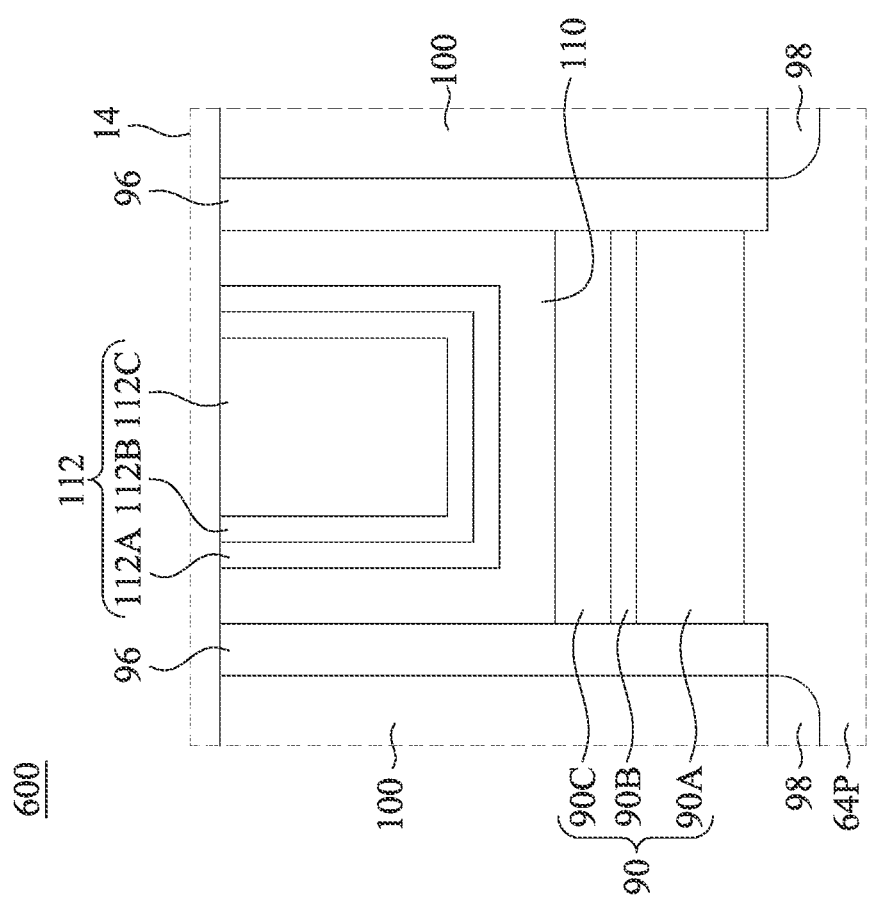
Figure 22D:
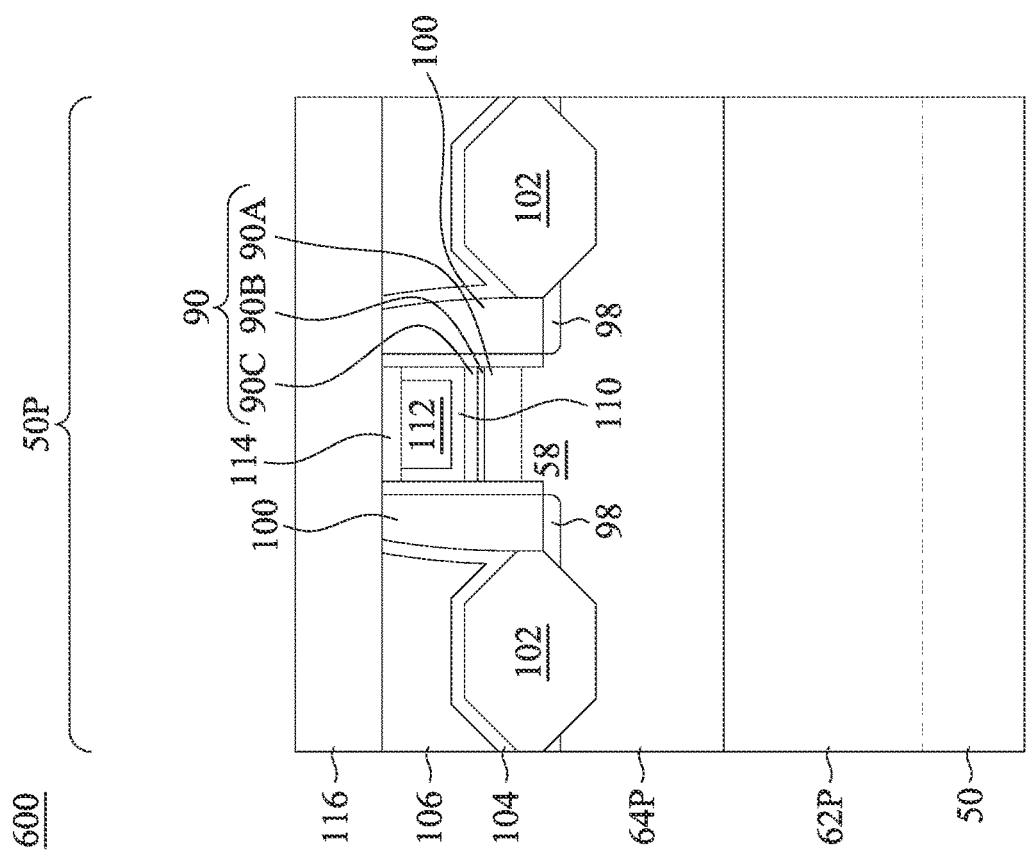
Figure 22C:
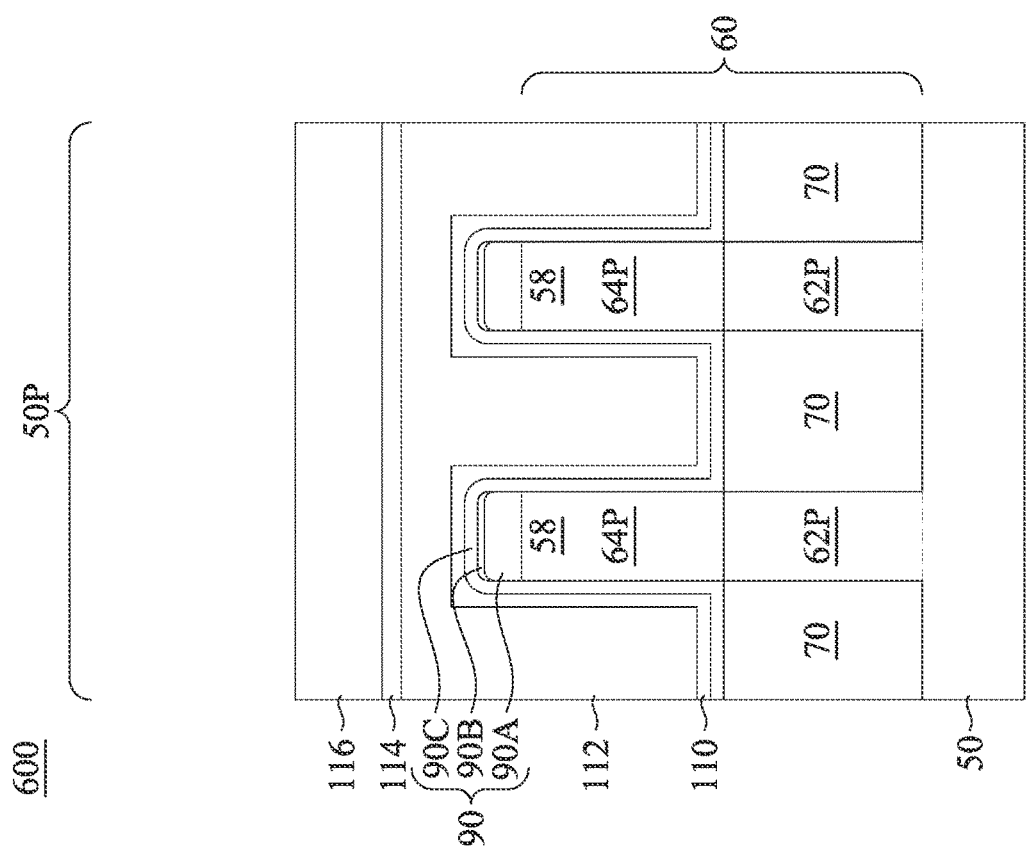
Figures 23A, 23B:
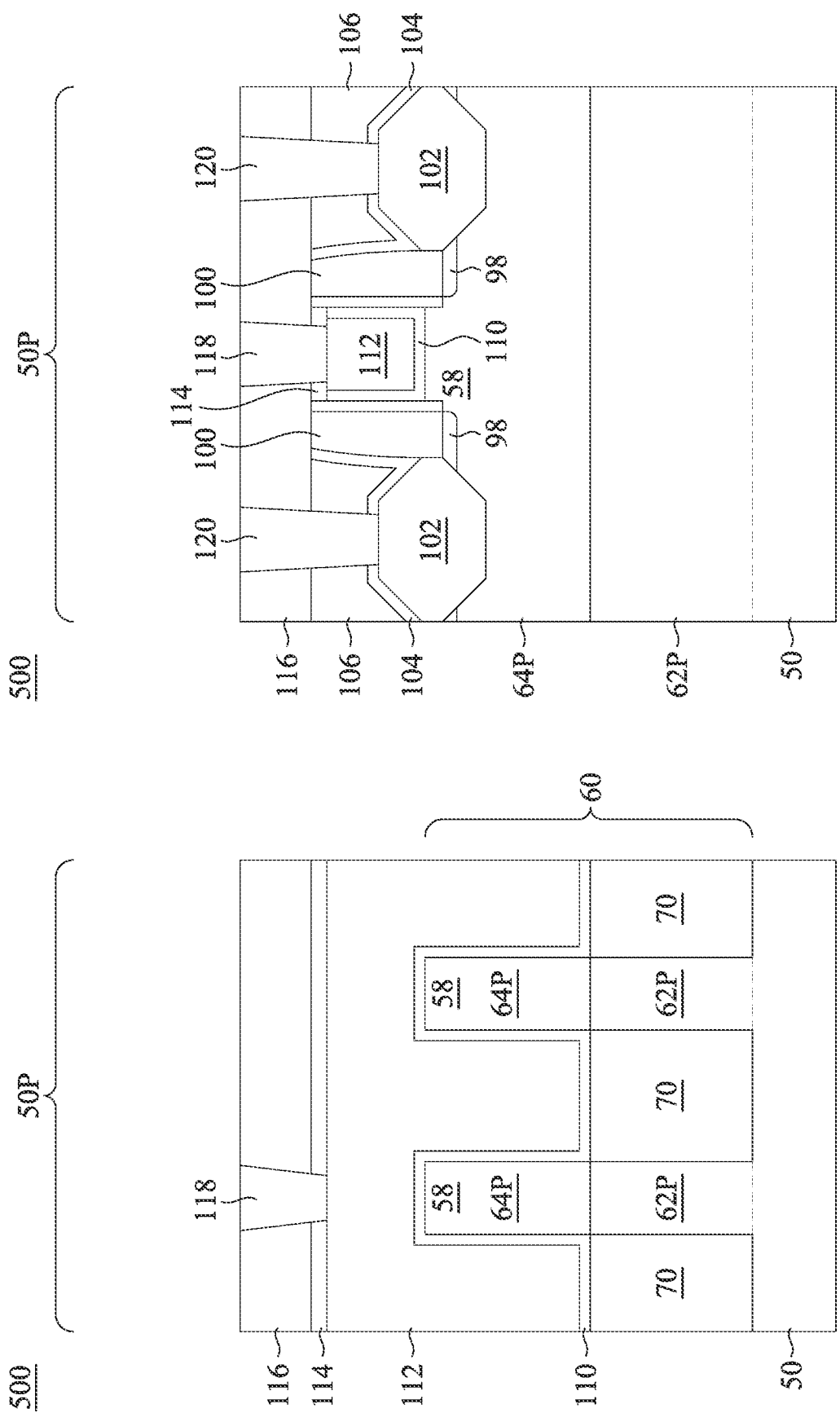
Figure 23D:
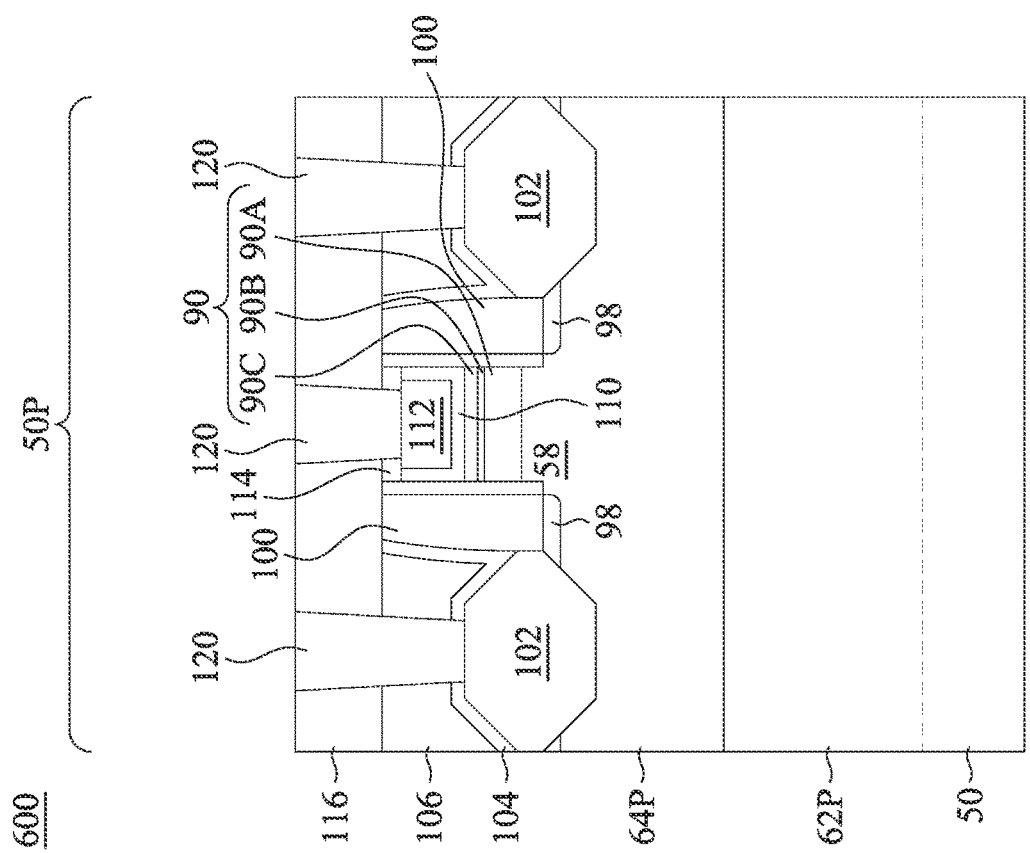
Figure 23C:
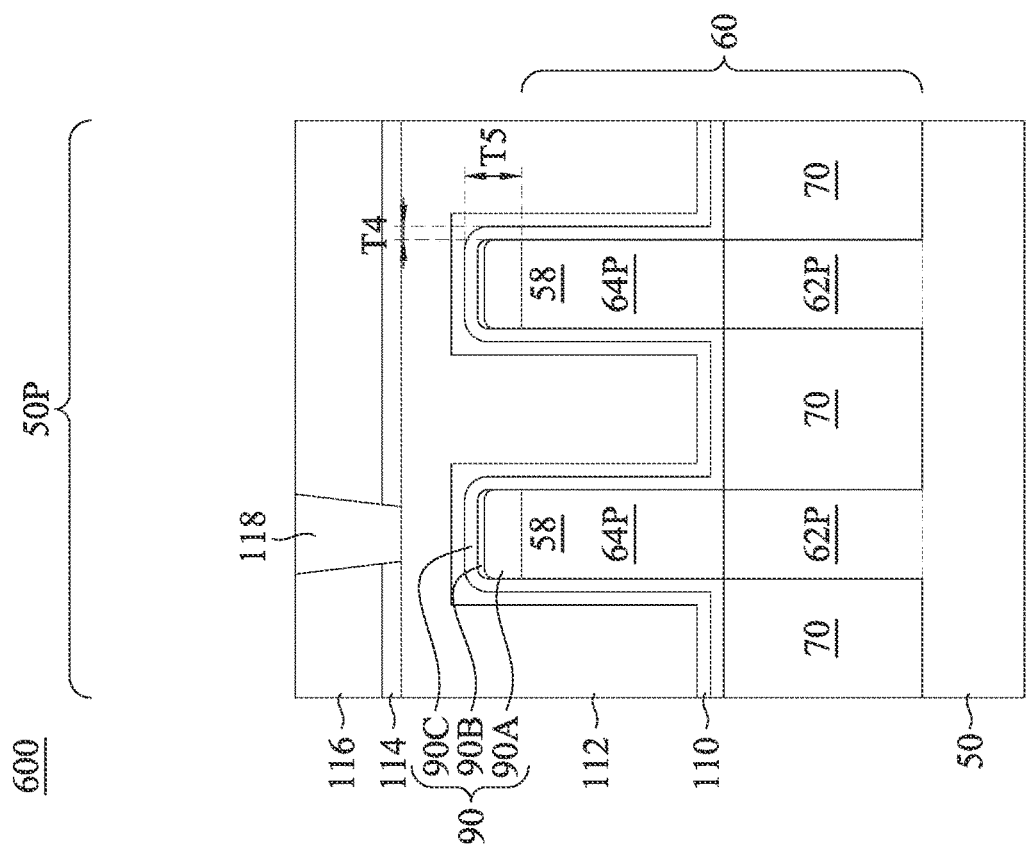
Figures 24A, 24B:
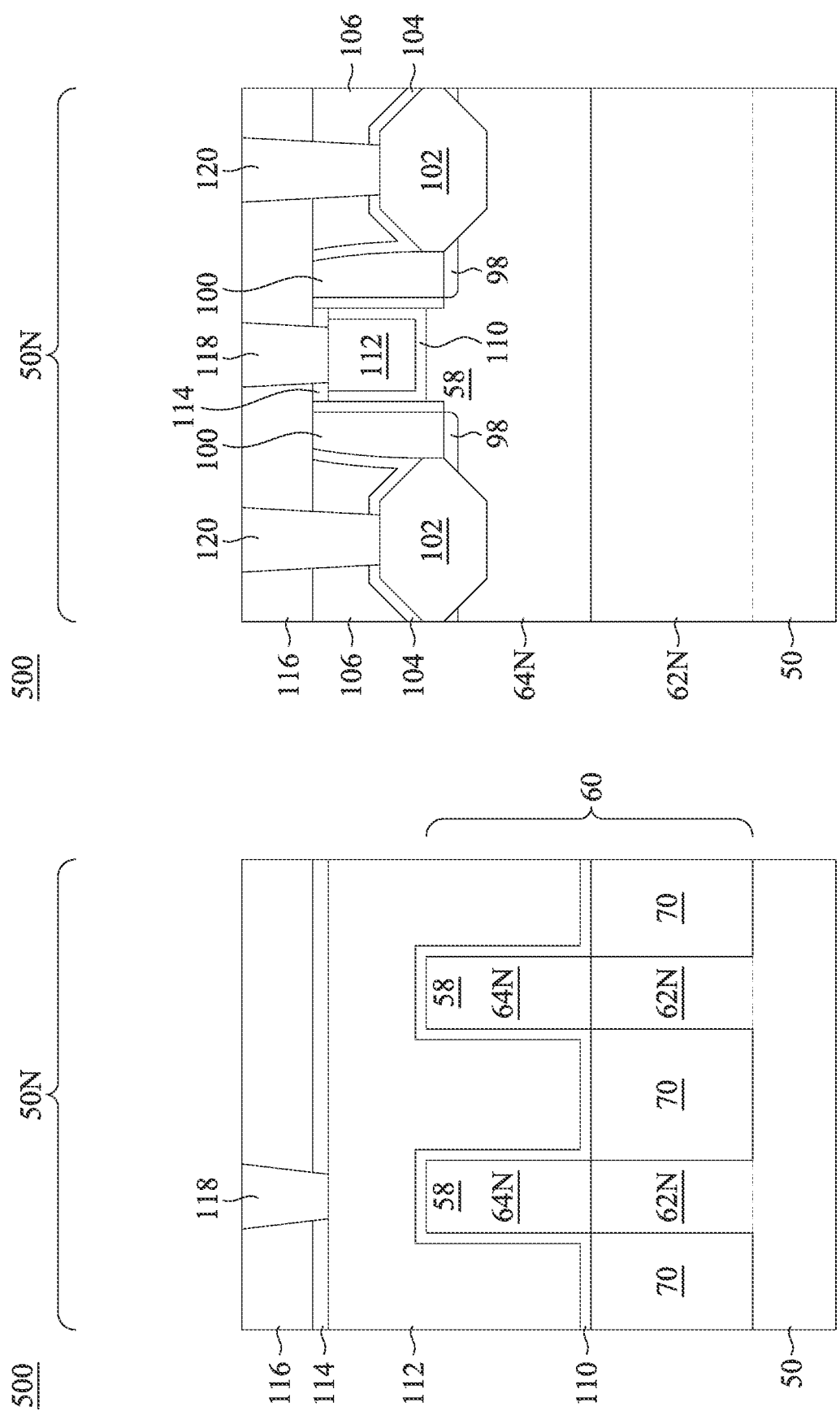
Figure 24D:
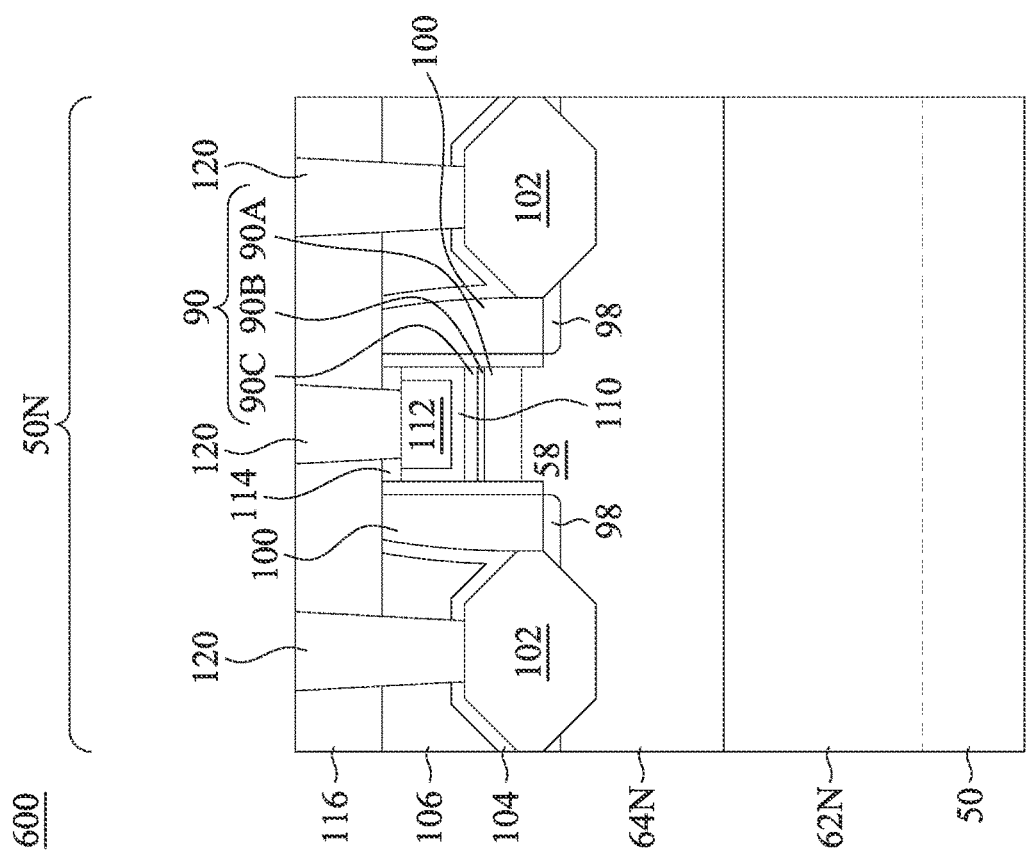
Figure 24C:
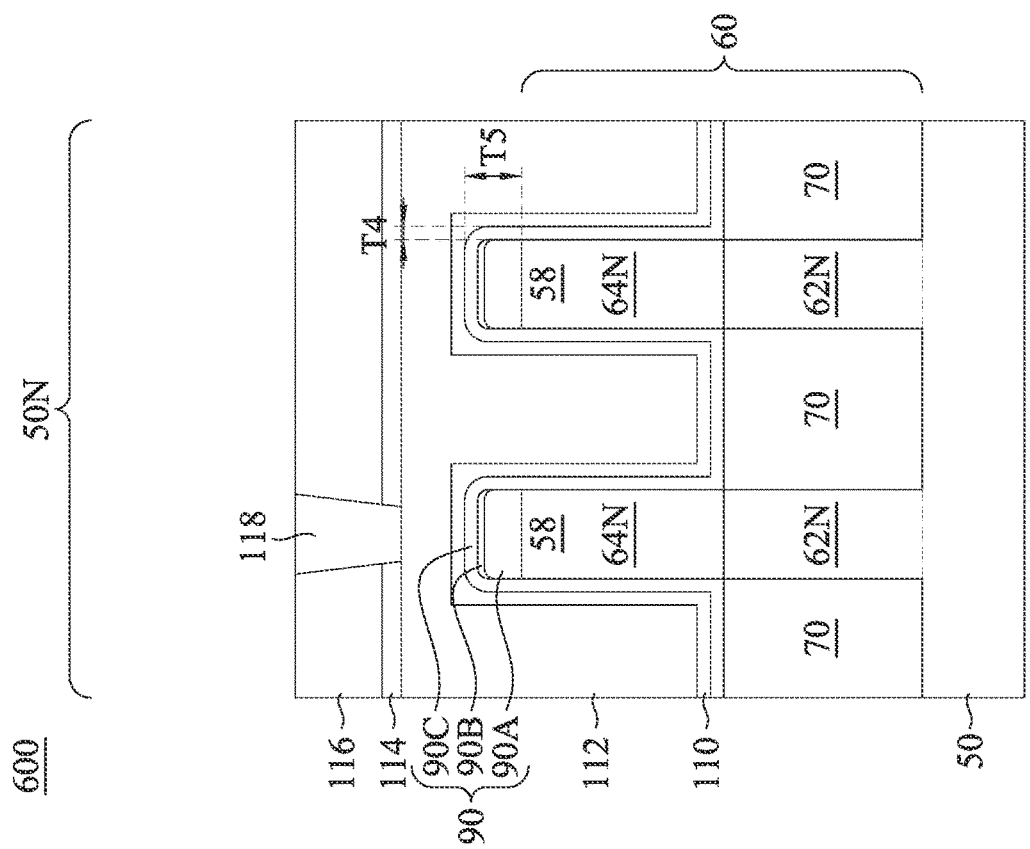

In FIGS. 21A, 21B, 21D, and 21E, gate dielectric layers 110 and gate electrodes 112 are formed for replacement gates. FIG. 21C illustrates a detailed view of region 12 of FIG. 21B, and FIG. 21F illustrates a detailed view of region 14 of FIG. 21E. Gate dielectric layers 110, comprising one or more layers, are deposited in the recesses 108. In some embodiments, in the first region 500 the gate dielectric layers 110 are deposited on the top surfaces and the sidewalls of the fins 60 and on sidewalls of the gate seal spacers 96/gate spacers 100 as illustrated in FIGS. 21A-B, and in the second region 600 the gate dielectric layers 110 are deposited on the top surfaces and the sidewalls of the dummy gate dielectric layer 90 and on sidewalls of the gate seal spacers 96/gate spacers 100 as illustrated in FIGS. 21D-E. The gate dielectric layers 110 may also be formed on the top surface of the first ILD 106. In some embodiments, the gate dielectric layers 110 comprise one or more dielectric layers, such as one or more layers of silicon oxide, silicon nitride, metal oxide, metal silicate, or the like. For example, in some embodiments, the gate dielectric layers 110 in the first region 500 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof, as illustrated in FIGS. 21A-B, and the gate dielectric layers 110 in the second region 600 include a high-k dielectric material as illustrated in FIGS. 21D-E. The gate dielectric layers 110 may include a dielectric layer having a k value greater than about 7.0. The formation methods of the gate dielectric layers 110 may include Molecular-Beam Deposition (MBD), ALD, PECVD, and the like.

The gate electrodes 112 are deposited over the gate dielectric layers 110, respectively, and fill the remaining portions of the recesses 108. The gate electrodes 112 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 112 is illustrated in FIGS. 21B and 21E, the gate electrode 112 may comprise any number of liner layers 112A, any number of work function tuning layers 112B, and a fill material 112C as illustrated by FIGS. 21C and 21F. After the filling of the recesses 108, a planarization process, such as a CMP, may be performed to remove the excess portions of the gate dielectric layers 110 and the material of the gate electrodes 112, which excess portions are over the top surface of the ILD 106. The remaining portions of material of the gate electrodes 112 and the gate dielectric layers 110 thus form replacement gates of the resulting FinFETs. The gate electrodes 112 and the gate dielectric layers 110 may be collectively referred to as a "gate stack." The gate and the gate stacks may extend along sidewalls of a channel region 58 of the fins 60.

The formation of the gate dielectric layers 110 in the n-type region 50N and the p-type region 50P may occur simultaneously such that the gate dielectric layers 110 in each region are formed from the same materials, and the formation of the gate electrodes 112 may occur simultaneously such that the gate electrodes 112 in each region are formed from the same materials. In some embodiments, the gate dielectric layers 110 in each region may be formed by distinct processes, such that the gate dielectric layers 110 may be different materials, and/or the gate electrodes 112 in each region may be formed by distinct processes, such that the gate electrodes 112 may be different materials. Various masking steps may be used to mask and expose appropriate regions when using distinct processes.

In FIGS. 22A through 22D, a gate mask 114 is formed over the gate stack (including a gate dielectric layer 110 and a corresponding gate electrode 112), and the gate mask may be disposed between opposing portions of the gate spacers 100. In some embodiments, forming the gate mask 114 includes recessing the gate stack so that a recess is formed directly over the gate stack and between opposing portions of gate spacers 100. A gate mask 114 comprising one or more layers of dielectric material, such as silicon nitride, silicon oxynitride, or the like, is filled in the recess, followed by a planarization process to remove excess portions of the dielectric material extending over the first ILD 106. The gate mask 114 is optional and may be omitted in some embodiments. In such embodiments, the gate stack may remain level with top surfaces of the first ILD 106.

As also illustrated in FIGS. 22A through 22D, a second ILD 116 is deposited over the first ILD 106. In some embodiments, the second ILD 116 is a flowable film formed by a flowable CVD method. In some embodiments, the second ILD 116 is formed of a dielectric material such as PSG, BSG, BPSG, USG, or the like, and may be deposited by any suitable method, such as CVD and PECVD. The subsequently formed gate contacts 118 (see below, FIGS. 23A through 23D) penetrate through the second ILD 116 and the gate mask 114 (if present) to contact the top surface of the recessed gate electrode 112.

In FIGS. 23A through 23D, gate contacts 118 and source/drain contacts 120 are formed through the second ILD 116 and the first ILD 106 in the p-type region 50P, in accordance with some embodiments. Openings for the source/drain contacts 120 are formed through the first and second ILDs 106 and 116, and openings for the gate contacts 118 are formed through the second ILD 116 and the gate mask 114 (if present). The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 116. The remaining liner and conductive material form the source/drain contacts 120 and gate contacts 118 in the openings. An anneal process may be performed to form a silicide at the interface between the epitaxial source/drain regions 102 and the source/drain contacts 120. The source/drain contacts 120 are physically and electrically coupled to the epitaxial source/drain regions 102, and the gate contacts 118 are physically and electrically coupled to the gate electrodes 112. The source/drain contacts 120 and gate contacts 118 may be formed in different processes, or may be formed in the same process. Although shown as being formed in the same cross-sections, it should be appreciated that each of the source/drain contacts 120 and gate contacts 118 may be formed in different cross-sections, which may avoid shorting of the contacts.

FIGS. 24A through 24D illustrate gate contacts 118 and source/drain contacts 120 formed through the second ILD 116 and the first ILD 106 in the n-type region 50N, in accordance with some embodiments. The structures illustrated in FIGS. 24A through 24D may be formed from the structure illustrated in FIGS. 11A and 11B in the n-type region 50N with similar methods as used in forming structures in the p-type region 50P as described in respect to FIGS. 12A-23D.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Embodiments may achieve advantages. Dielectric layers including a mask layer are formed over semiconductor fins prior to forming dummy gates over the fins. The mask layer enables a greater thickness of dielectric material to be formed over the top surfaces of the fins than over sidewalls of the fins. The greater thickness of the dielectric layers over the top surfaces of the fins may boost device performance during subsequent patterning processes of the dummy gates. Because the process to form the dielectric layers can be integrated with and followed by a standard oxidation deposition process, the process to form the dielectric layers is low cost may achieve high rates of wafers per hour.

In accordance with an embodiment, a method of forming a semiconductor device includes: forming a semiconductor fin and an isolation region adjacent the semiconductor fin; forming a first layer on the semiconductor fin; forming a mask on the first layer, the mask being thicker on a top of the semiconductor fin than along a sidewall of the semiconductor fin; thinning the first layer along the sidewall of the semiconductor fin using the mask, the thinning the first layer removing portions of the mask; forming a second layer on the semiconductor fin, the second layer covering remaining portions of the mask and remaining portions of the first layer; forming a dummy gate layer on the semiconductor fin;

and patterning the dummy gate layer, wherein patterning the dummy gate layer exposes a top surface of the semiconductor fin. In an embodiment, forming the first layer includes forming the first layer on the isolation region, wherein thinning the first layer removes a first portion of the first layer on the isolation region, and wherein thinning the first layer further removes a second portion of the first layer on sidewalls of the semiconductor fin. In an embodiment, before thinning the first layer, the mask has a first thickness in a range of 5 Å to 10 Å. In an embodiment, after thinning the first layer, the mask has a second thickness in a range of 2 Å to 5 Å. In an embodiment, the second layer is formed to a thickness in a range of 15 Å to 35 Å. In an embodiment, after forming the second layer, the first layer, the mask, and the second layer have a combined thickness in a range of 45 Å to 65 Å. In an embodiment, after forming the second layer, a ratio of a combined thickness of the first layer, the mask, and the second layer to a thickness of the second layer is in a range of 2:1 to 5:1. In an embodiment, patterning the dummy gate layer etches an upper portion of the semiconductor fin by a distance less than 2 nm. In an embodiment, depositing the first layer includes performing a plasma enhanced atomic layer deposition of silicon oxide. In an embodiment, the method further includes performing an $O_2$ plasma treatment on the first layer.

In accordance with another embodiment, a method of forming a semiconductor device includes: depositing a first dielectric layer with a plasma enhanced atomic layer deposition over a first semiconductor fin and a second semiconductor fin, wherein the first semiconductor fin is in a first region of a die and the second semiconductor fin is in a second region of a die; forming a mask layer over the first dielectric layer, wherein the mask layer covers a top surface of a portion of the first dielectric layer over the first semiconductor fin and the second semiconductor fin, a thickness of the mask layer tapering along upper portions of sidewalls of the first dielectric layer; removing exposed portions of the first dielectric layer; depositing a second dielectric layer over the mask layer and remaining portions of the first dielectric layer over the first semiconductor fin and the second semiconductor fin; removing a first portion of the second dielectric layer, a first portion of the mask layer, and a first portion of the first dielectric layer over the first semiconductor fin, wherein a second portion of the first dielectric layer, a second portion of the mask layer, and a second portion of the second dielectric layer remain on the second semiconductor fin; and forming a first gate electrode over the first semiconductor fin and forming a second gate electrode over the second portion of the second dielectric layer. In an embodiment, forming the mask layer includes using Bis(diethylamino)silane (BDEAS) or $SiH_3$—N$((CH—(CH_3)_2)_2$ as precursors. In an embodiment, forming the mask layer includes using atomic layer deposition with a plasma generation power in a range of 15 W to 150 W. In an embodiment, forming the mask layer is performed at a pressure in a range of 1500 torr to 3500 torr. In an embodiment, forming the mask layer includes a purge time in a range of 0.5 s to 0.25 s. In an embodiment, forming the mask layer includes a plasma treatment time in a range of 0.5 s to 0.25 s.

In accordance with yet another embodiment, a semiconductor device includes: a first semiconductor fin in a first region of a die and a second semiconductor fin in a second region of the die; a first gate dielectric on the first semiconductor fin, the first gate dielectric physically contacting a top surface of the first semiconductor fin; a first dielectric layer on the second semiconductor fin; a second dielectric layer on the first dielectric layer, the second dielectric layer including carbon; a third dielectric layer on the second dielectric layer; a second gate dielectric on the third dielectric layer; a first gate electrode on the first gate dielectric; and a second gate electrode on the second gate dielectric. In an embodiment, the first dielectric layer, the second dielectric layer, and the third dielectric layer have a combined thickness over a top surface of the second semiconductor fin in a range of 45 Å to 65 Å. In an embodiment, the third dielectric layer has a thickness on a sidewall of the second semiconductor fin in a range of 15 Å to 35 Å. In an embodiment, the second dielectric layer is silicon nitride, silicon carbonitride, or silicon oxycarbonitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a semiconductor fin and an isolation region adjacent the semiconductor fin;
    forming a first layer on the semiconductor fin;
    forming a mask on the first layer, the mask being thicker on a top of the semiconductor fin than along a sidewall of the semiconductor fin;
    thinning the first layer along the sidewall of the semiconductor fin using the mask, the thinning the first layer removing portions of the mask;
    forming a second layer on the semiconductor fin, the second layer covering remaining portions of the mask and remaining portions of the first layer;
    forming a dummy gate layer on the semiconductor fin; and
    patterning the dummy gate layer, wherein patterning the dummy gate layer exposes a top surface of the semiconductor fin.

2. The method of claim 1, wherein forming the first layer comprises forming the first layer on the isolation region, wherein thinning the first layer removes a first portion of the first layer on the isolation region, and wherein thinning the first layer further removes a second portion of the first layer on sidewalls of the semiconductor fin.

3. The method of claim 1, wherein before thinning the first layer, the mask has a first thickness in a range of 5 Å to 10 Å.

4. The method of claim 1, wherein after thinning the first layer, the mask has a second thickness in a range of 2 Å to 5 Å.

5. The method of claim 1, wherein the second layer is formed to a thickness in a range of 15 Å to 35 Å.

6. The method of claim 1, wherein, after forming the second layer, the first layer, the mask, and the second layer have a combined thickness in a range of 45 Å to 65 Å.

7. The method of claim 1, wherein, after forming the second layer, a ratio of a combined thickness of the first layer, the mask, and the second layer to a thickness of the second layer is in a range of 2:1 to 5:1.

8. The method of claim 1, wherein patterning the dummy gate layer etches an upper portion of the semiconductor fin by a distance less than 2 nm.

9. The method of claim 1, wherein depositing the first layer comprises performing a plasma enhanced atomic layer deposition of silicon oxide.

10. The method of claim 1, further comprising performing an $O_2$ plasma treatment on the first layer.

11. A method of forming a semiconductor device, the method comprising:
depositing a first dielectric layer with a plasma enhanced atomic layer deposition over a first semiconductor fin and a second semiconductor fin, wherein the first semiconductor fin is in a first region of a die and the second semiconductor fin is in a second region of the die;
forming a mask layer over the first dielectric layer, wherein the mask layer covers a top surface of a portion of the first dielectric layer over the first semiconductor fin and the second semiconductor fin, a thickness of the mask layer tapering along upper portions of sidewalls of the first dielectric layer;
removing exposed portions of the first dielectric layer;
depositing a second dielectric layer over the mask layer and remaining portions of the first dielectric layer over the first semiconductor fin and the second semiconductor fin;
removing a first portion of the second dielectric layer, a first portion of the mask layer, and a first portion of the first dielectric layer over the first semiconductor fin, wherein a second portion of the first dielectric layer, a second portion of the mask layer, and a second portion of the second dielectric layer remain on the second semiconductor fin; and
forming a first gate electrode over the first semiconductor fin and forming a second gate electrode over the second portion of the second dielectric layer.

12. The method of claim 11, wherein forming the mask layer comprises using Bis(diethylamino)silane (BDEAS) or $SiH_3-N((CH-(CH_3)_2)_2$ as precursors.

13. The method of claim 11, wherein forming the mask layer comprises using atomic layer deposition with a plasma generation power in a range of 15 W to 150 W.

14. The method of claim 11, wherein forming the mask layer is performed at a pressure in a range of 1500 torr to 3500 torr.

15. The method of claim 11, wherein forming the mask layer comprises a purge time in a range of 0.5 s to 0.25 s.

16. The method of claim 11, wherein forming the mask layer comprises a plasma treatment time in a range of 0.5 s to 0.25 s.

17. A method of forming a semiconductor device, the method comprising:
forming a first semiconductor fin in a first region of a substrate and a second semiconductor fin in a second region of the substrate;
forming a first dielectric layer on the second semiconductor fin;
forming a second dielectric layer on the first dielectric layer, the second dielectric layer comprising carbon;
forming a third dielectric layer on the second dielectric layer, wherein the first dielectric layer, the second dielectric layer, and the third dielectric layer have a combined thickness over a top surface of the second semiconductor fin in a range from 45 Å to 65 Å;
forming a first gate dielectric layer on the first semiconductor fin;
forming a second gate dielectric layer on the third dielectric layer, wherein the third dielectric layer is between the first dielectric layer and the second gate dielectric layer;
forming a first gate electrode on the first gate dielectric layer; and
forming a second gate electrode on the second gate dielectric layer.

18. The method of claim 17, wherein the third dielectric layer has a thickness on a sidewall of the second semiconductor fin in a range from 15 Å to 35 Å.

19. The method of claim 17, wherein the second dielectric layer comprises silicon carbonitride or silicon oxycarbonitride.

20. The method of claim 17, wherein a ratio of the combined thickness to a thickness of the third dielectric layer is in a range from 2:1 to 5:1.

* * * * *